(12) United States Patent
Kim et al.

(10) Patent No.: US 11,456,317 B2
(45) Date of Patent: Sep. 27, 2022

(54) MEMORY DEVICE

(71) Applicant: Samsung Electronics Co., Ltd., Suwon-si (KR)

(72) Inventors: Chanho Kim, Seoul (KR); Daeseok Byeon, Seongnam-si (KR); Dongku Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 17/023,053

(22) Filed: Sep. 16, 2020

(65) Prior Publication Data

US 2021/0091113 A1 Mar. 25, 2021

Related U.S. Application Data

(63) Continuation-in-part of application No. 16/923,636, filed on Jul. 8, 2020.

(30) Foreign Application Priority Data

Sep. 24, 2019 (KR) ........................ 10-2019-0117491

(51) Int. Cl.

| H01L 27/11573 | (2017.01) |
| H01L 27/11582 | (2017.01) |
| G11C 8/14 | (2006.01) |
| H01L 23/522 | (2006.01) |
| H01L 23/528 | (2006.01) |

(Continued)

(52) U.S. Cl.
CPC .......... *H01L 27/11582* (2013.01); *G11C 8/14* (2013.01); *H01L 23/5226* (2013.01); *H01L 23/5283* (2013.01); *H01L 27/11519* (2013.01); *H01L 27/11526* (2013.01); *H01L 27/11556* (2013.01); *H01L 27/11565* (2013.01); *H01L 27/11573* (2013.01)

(58) Field of Classification Search
CPC .................................................. H01L 27/11573
See application file for complete search history.

(56) References Cited

U.S. PATENT DOCUMENTS 9,853,047 B2 12/2017 Choi
9,960,173 B2 5/2018 Shimojo
(Continued)

OTHER PUBLICATIONS

First Office Action dated Jan. 31, 2022 for corresponding DE Patent Application No. 102020111649.7.

*Primary Examiner* — Yu-Hsi D Sun
(74) *Attorney, Agent, or Firm* — Muir Patent Law PLLC

(57) ABSTRACT

A memory device includes a peripheral circuit region comprising a first substrate, a plurality of metal layers over the first substrate, and a first metal pad, a cell region comprising a second substrate, a plurality of gate lines over the second substrate, a plurality of upper interconnection layers in the second substrate, and a second metal pad, wherein the cell region is vertically connected to the peripheral circuit region by the first metal pad and the second metal pad, a common source line between the second substrate and the plurality of gate lines, the common source line comprising a through hole, and a word line cut region extending across the plurality of gate lines and extending through the through hole of the common source line to be connected to a first upper interconnection layer from among the plurality of upper interconnection layers.

20 Claims, 28 Drawing Sheets

(51) Int. Cl.
   *H01L 27/11526*   (2017.01)
   *H01L 27/11519*   (2017.01)
   *H01L 27/11556*   (2017.01)
   *H01L 27/11565*   (2017.01)

(56) References Cited

U.S. PATENT DOCUMENTS

| | | |
|---|---|---|
| 9,960,181 B1 | 5/2018 | Cui et al. |
| 10,276,586 B2 | 4/2019 | Murakoshi et al. |
| 2016/0163732 A1 | 6/2016 | Lim et al. |
| 2017/0179153 A1 | 6/2017 | Ogawa et al. |
| 2019/0051665 A1 | 2/2019 | Yun et al. |
| 2019/0081053 A1 | 3/2019 | Nojima et al. |
| 2019/0081062 A1* | 3/2019 | Wada ................ H01L 27/11568 |
| 2019/0115357 A1 | 4/2019 | Oh et al. |
| 2019/0267333 A1* | 8/2019 | Hong ................ H01L 27/11582 |
| 2021/0343342 A1* | 11/2021 | Lee ................ G11C 16/0483 |

* cited by examiner

MEMORY DEVICE

CROSS-REFERENCE TO RELATED APPLICATIONS

This application is a continuation-in-part application of U.S. patent application Ser. No. 16/923,636, filed Jul. 8, 2020, which claims the benefit of priority to Korean Patent Application No. 10-2019-0117491, filed on Sep. 24, 2019, in the Korean Intellectual Property Office, the disclosure of each of which is incorporated herein in its entirety by reference.

BACKGROUND

The inventive concept relates to a memory device, and more particularly, to a memory device having a cell over periphery (COP) structure.

With the multi-functionalization of information communication devices, high-capacity highly integrated IC devices including memory devices have been required more and more, memory cells have gradually been downscaled, and operating circuits and interconnection structures, which are included in the memory devices to enable operations and electrical connection of the memory devices, have become complicated. Accordingly, there is a need for an IC device including a memory device, which is configured to improve an integration density and have good electrical characteristics.

SUMMARY

The disclosed embodiments provide a memory device, which has an improved integration density and a reduced chip size and is configured to increase a degree of freedom for layout design and improve the reliability of an interconnection structure.

According to an aspect of the inventive concept, there is provided a memory device comprising a peripheral circuit region comprising a first substrate, a plurality of metal layers over the first substrate, and a first metal pad, a cell region comprising a second substrate, a plurality of gate lines over the second substrate, a plurality of upper interconnection layers in the second substrate, and a second metal pad, wherein the cell region is vertically connected to the peripheral circuit region by the first metal pad and the second metal pad, a common source line between the second substrate and the plurality of gate lines, the common source line comprising a through hole, and a word line cut region extending across the plurality of gate lines and extending through the through hole of the common source line to be connected to a first upper interconnection layer from among the plurality of upper interconnection layers.

According to an aspect of the inventive concept, there is provided a memory device comprising a peripheral circuit region comprising a peripheral circuit structure and a first metal pad, and a cell region comprising a substrate, a plurality of upper interconnection layers in the substrate, a cell array structure on the substrate, a common source line interposed between the substrate and the cell array structure, and a second metal pad, wherein the cell region is vertically connected to the peripheral circuit region by the first metal pad and the second metal pad, wherein the cell array structure comprises a memory stack including a memory cell region and a connection stepped region located at one side of the memory cell region, the memory cell region having a plurality of gate lines, and a word line cut region extending across the plurality of gate lines and extending through a through hole of the common source line to be connected to a first upper interconnection layer from among the plurality of upper interconnection layers, the first upper interconnection layer being a floating conductive interconnection layer spaced apart from other upper interconnection layers of the plurality of upper interconnection layers.

According to an aspect of the inventive concept, there is provided a memory device comprising a peripheral circuit region comprising a first substrate, a plurality of peripheral circuit conductive interconnection layers formed on the first substrate, and a first metal pad, a cell region comprising a second substrate, a plurality of upper interconnection layers in the second substrate, a cell array structure comprising a plurality of gate lines on the second substrate, a common source line interposed between the second substrate and the cell array structure, and a second metal pad, wherein the cell region is vertically connected to the peripheral circuit region by the first metal pad and the second metal pad, and a word line cut region comprising a first portion and a second portion, the first portion extending lengthwise in a lateral direction across the plurality of gate lines and the through hole, the second portion being integrally connected to the first portion and extending through a portion of the second substrate to a first upper interconnection layer from among the plurality of upper interconnection layers.

BRIEF DESCRIPTION OF THE DRAWINGS

Embodiments of the inventive concept will be more clearly understood from the following detailed description taken in conjunction with the accompanying drawings in which:

FIGS. 15A to 19A and to 15B to 19B are cross-sectional views illustrating a process sequence of a method of manufacturing an IC device, according to an embodiment, wherein FIGS. 15A-19A are cross-sectional views of some components according to the process sequence in a portion corresponding to a cross-section taken along a line X1-X1' of FIG. 4, and FIG. 15B-19B are cross-sectional views of some components according to the process sequence in the portion corresponding to a cross-section taken along a line Y1-Y1' of FIG. 4;

DETAILED DESCRIPTION OF THE EMBODIMENTS

Figure 1:
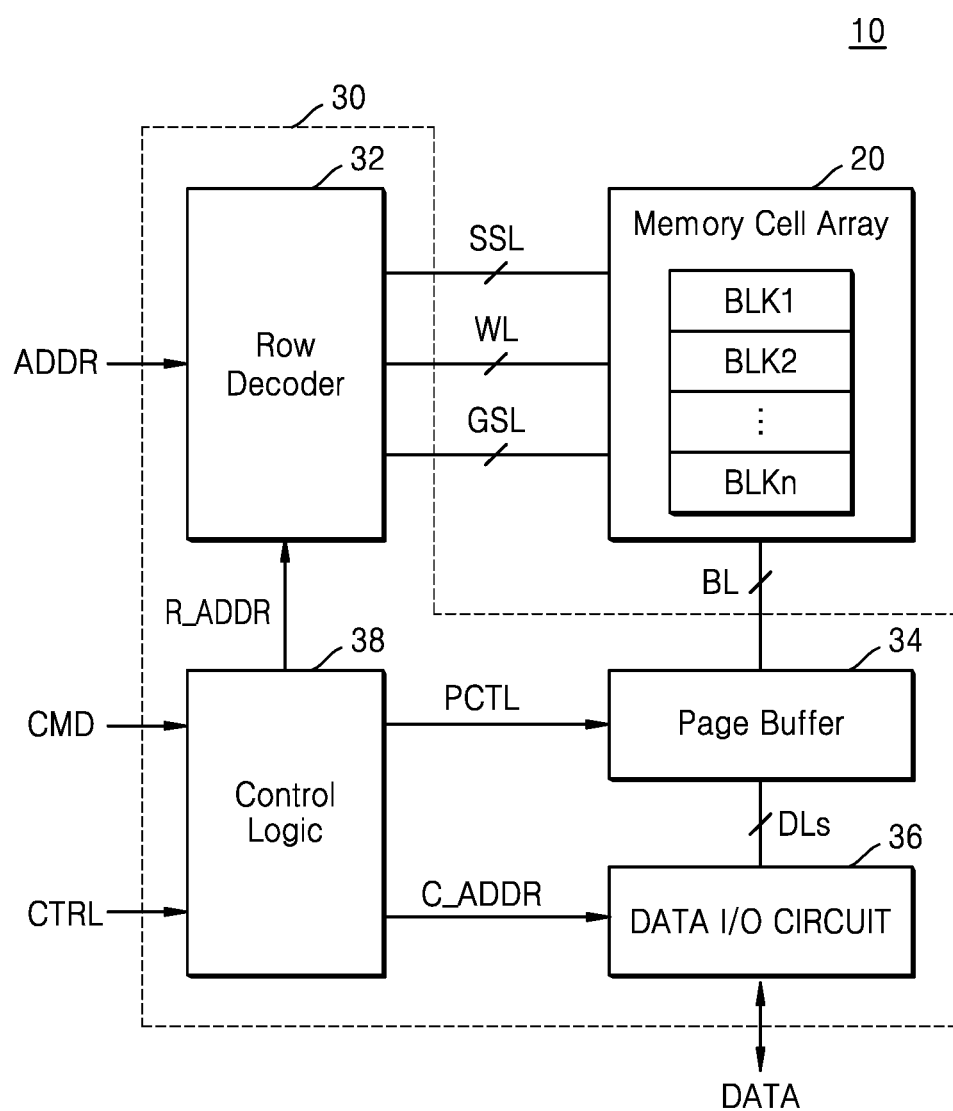
FIG. 1 is a block diagram of an integrated circuit (IC) device according to an embodiment.

Embodiments will now be described more fully with reference to the accompanying drawings in which some embodiments are shown. The same reference numerals are used to denote the same elements throughout the drawings, repeated descriptions thereof will be omitted.

FIG. 1 is a block diagram of an integrated circuit (IC) device 10 according to an embodiment.

Referring to FIG. 1, the IC device 10 may include a memory cell array 20 and a peripheral circuit 30. The memory cell array 20 may include a plurality of memory cell blocks BLK1, BLK2, . . . , and BLKn. Each of the plurality of memory cell blocks BLK1, BLK2, . . . , and BLKn may include a plurality of memory cells. The memory cell blocks BLK1, BLK2, . . . , and BLKn may be connected to the peripheral circuit 30 through a bit line BL (e.g., a plurality of bit lines), a word line WL (e.g., a plurality of word lines), a string selection line SSL (e.g., a plurality of string selection lines), and a ground selection line GSL (e.g., a plurality of ground select lines).

The peripheral circuit 30 may include a row decoder 32, a page buffer 34, a data input/output (I/O) circuit 36, and a control logic 38. Although not shown in FIG. 1, the peripheral circuit 30 may further include an input/output (I/O) interface, a column logic, a voltage generator, a pre-decoder, a temperature sensor, a command decoder, an address decoder, and an amplification circuit.

The memory cell array 20 may be connected to the page buffer 34 through the bit line BL and connected to the row decoder 32 through the word line WL, the string selection line SSL, and the ground selection line GSL. In the memory cell array 20, each of the plurality of memory cells included in each of the plurality of memory cell blocks BLK1, BLK2, . . . , and BLKn may be a flash memory cell. The memory cell array 20 may be a three-dimensional (3D) memory cell array. The 3D memory cell array may include a plurality of NAND strings, each of which may include memory cells respectively connected to a plurality of word lines WL vertically stacked on a substrate. In example embodiments, the memory cell array 20 may include a memory stack MS, which will be described below with reference to FIGS. 4 and 5B.

The peripheral circuit 30 may receive an address ADDR, a command CMD, and a control signal CTRL from the outside of the IC device 10 and transmit and receive data DATA to and from a device located outside the IC device 10. The IC device may be, for example, a semiconductor chip such as a memory chip.

The row decoder 32 may select at least one of the plurality of memory cell blocks BLK1, BLK2, . . . , and BLKn in response to the address ADDR received from the outside, and select the word line WL, the string selection line SSL, and the ground selection line GSL of the selected memory cell block. The row decoder 32 may transmit a voltage for performing a memory operation to the word line WL of the selected memory cell block.

The page buffer 34 may be connected to the memory cell array 20 through the bit line BL. During a program operation, the page buffer 34 may operate as a write driver and apply a voltage corresponding to data DATA to be stored in the memory cell array 20 to the bit line BL. During a read operation, the page buffer 34 may operate as a sense amplifier and sense data DATA stored in the memory cell array 20. The page buffer 34 may operate in response to a control signal PCTL provided from the control logic 38.

The data I/O circuit 36 may be connected to the page buffer 34 through data lines DLs. During a program operation, the data I/O circuit 36 may receive data DATA from a memory controller (not shown) and provide program data DATA to the page buffer 34 based on a column address C_ADDR provided from the control logic 38. During a read operation, the data I/O circuit 36 may provide read data DATA stored in the page buffer 34 to the memory controller based on the column address C_ADDR provided from the control logic 38.

The data I/O circuit 36 may transmit a received address or instruction to the control logic 38 or the row decoder 32. The peripheral circuit 30 of the IC device 10 may further include an electrostatic discharge (ESD) circuit and a pull-up/pull-down driver.

The control logic 38 may receive a command CMD and a control signal CTRL from the memory controller. The control logic 38 may provide a row address R_ADDR to the row decoder 32 and provide the column address C_ADDR to the data I/O circuit 36. The control logic 38 may generate various internal control signals used in the IC device 10 in response to the control signal CTRL. For example, the control logic 38 may adjust voltage levels provided to the word line WL and the bit line BL during a memory operation, such as a program operation or an erase operation.

Figure 2:
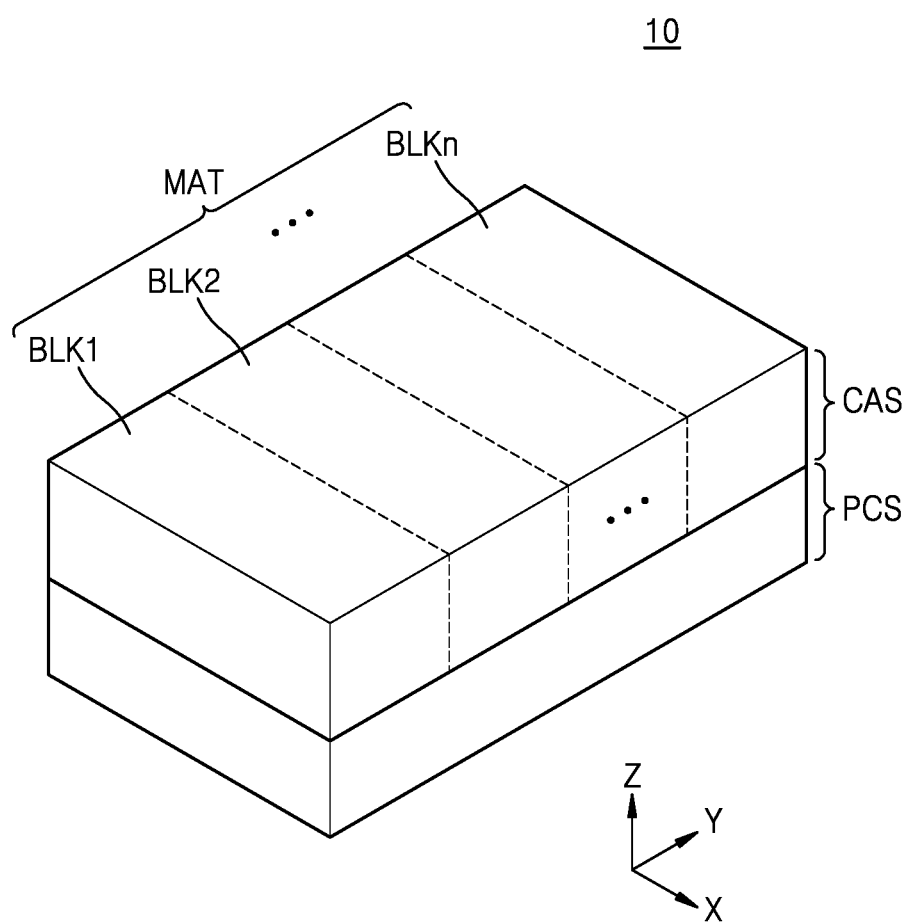
FIG. 2 is a schematic perspective view of an IC device according to an embodiment.

FIG. 2 is a perspective view of an IC device 10 according to an embodiment.

Referring to FIG. 2, the IC device 10 may include a cell array structure CAS and peripheral circuit structure PCS, which overlap each other (e.g., are overlaid) in a vertical direction (Z direction). The cell array structure CAS may include the memory cell array 20 described with reference to FIG. 1. The peripheral circuit structure PCS may include the peripheral circuit 30 described with reference to FIG. 1. The cell array structure CAS may be described as a cell array layer, and the peripheral circuit structure PCS may be described as a peripheral circuit layer. The cell array layer may be formed on (e.g., stacked on, in the vertical direction) the peripheral circuit layer, and each of the cell array layer and the peripheral circuit layer may include various components that form sub-layers.

The cell array structure CAS may include at least one mat MAT, each of which may include a plurality of memory cell blocks BLK1, BLK2, . . . , and BLKn. Each of the plurality of memory cell blocks BLK1, BLK2, . . . , and BLKn may include memory cells, which are three-dimensionally arranged.

Figure 3:
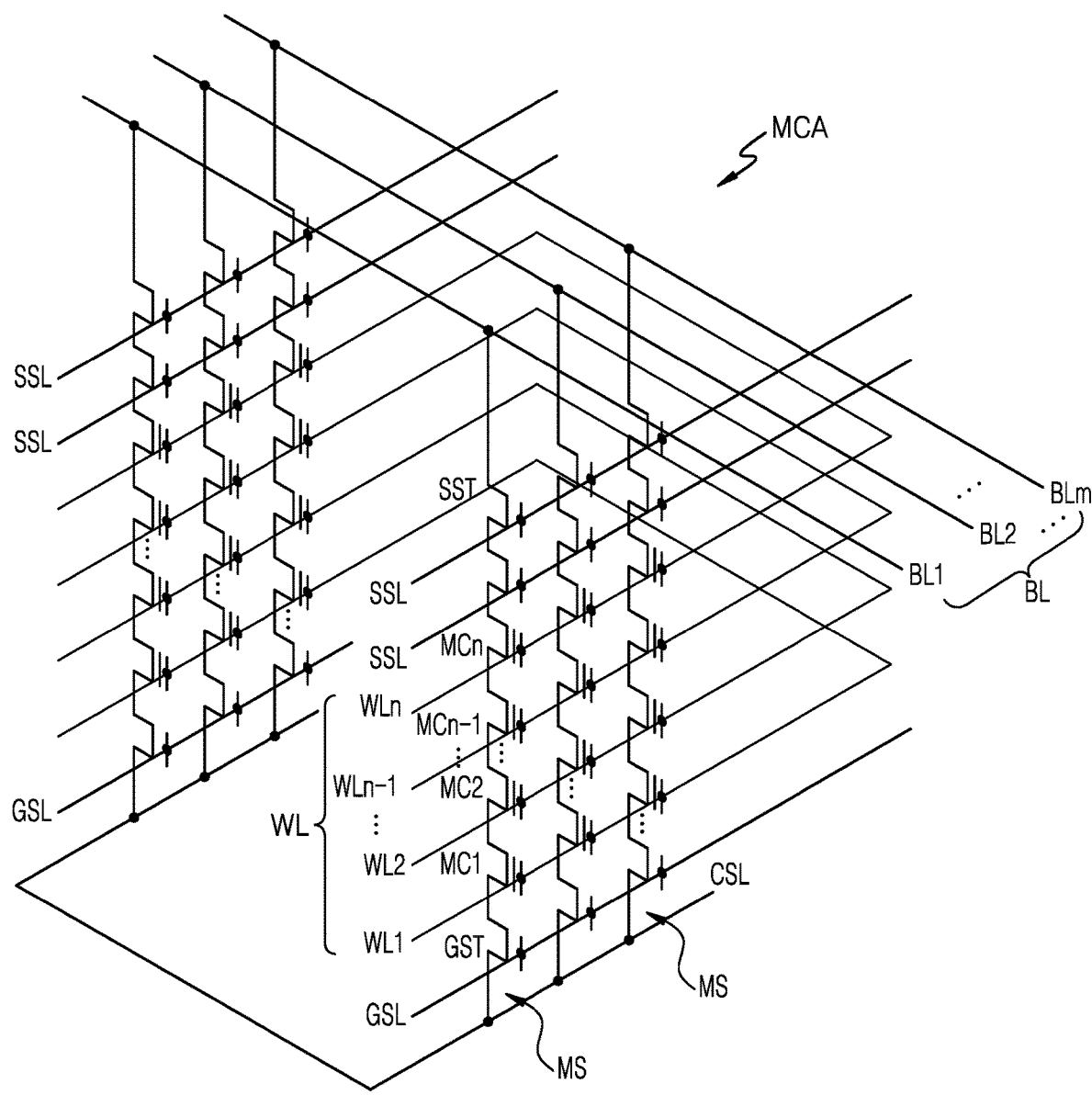
FIG. 3 is an equivalent circuit diagram of a memory cell array of an IC device according to an embodiment.

FIG. 3 is an equivalent circuit diagram of a memory cell array MCA of an IC device according to an embodiment. An equivalent circuit diagram of a vertical NAND (V-NAND) flash memory device having a vertical channel structure is exemplarily illustrated in FIG. 3. Each of the plurality of memory cell block BLK1, BLK2, . . . , and BLKn shown in FIG. 2 may include the memory cell array MCA shown in FIG. 3.

Referring to FIG. 3, the memory cell array MCA may include a plurality of memory cell strings MS. The memory cell array MCA may include a plurality of bit lines BL (or BL1, BL2, . . . , and BLm), a plurality of word lines WL (or WL1, WL2, . . . , WLn-1, and WLn), at least one string selection line SSL, at least one ground selection line GSL, and a common source line CSL. The plurality of memory cell strings MS may be formed between the plurality of bit lines BL (or BL1, BL2, . . . , and BLm) and the common source line CSL.

Each of the plurality of memory cell strings MS may include a string selection transistor SST, a ground selection transistor GST, and a plurality of memory cell transistors MC1, MC2, . . . , MCn-1, and MCn. Drain regions of a plurality of string selection transistors SST may be connected to the bit lines BL (or BL1, BL2, . . . , and BLm), and source regions of a plurality of ground selection transistors GST may be connected to the common source line CSL. The common source line CSL may be a region to which the source regions of the plurality of ground selection transistors GST are connected in common.

The string selection transistor SST may be connected to the string selection line SSL, and the ground selection transistor GST may be connected to the ground selection line GSL. The plurality of memory cell transistors MC1, MC2, . . . , MCn-1, and MCn may be respectively connected to the plurality of word lines WL (or WL1, WL2, . . . , WLn-1, and WLn).

Figure 4:
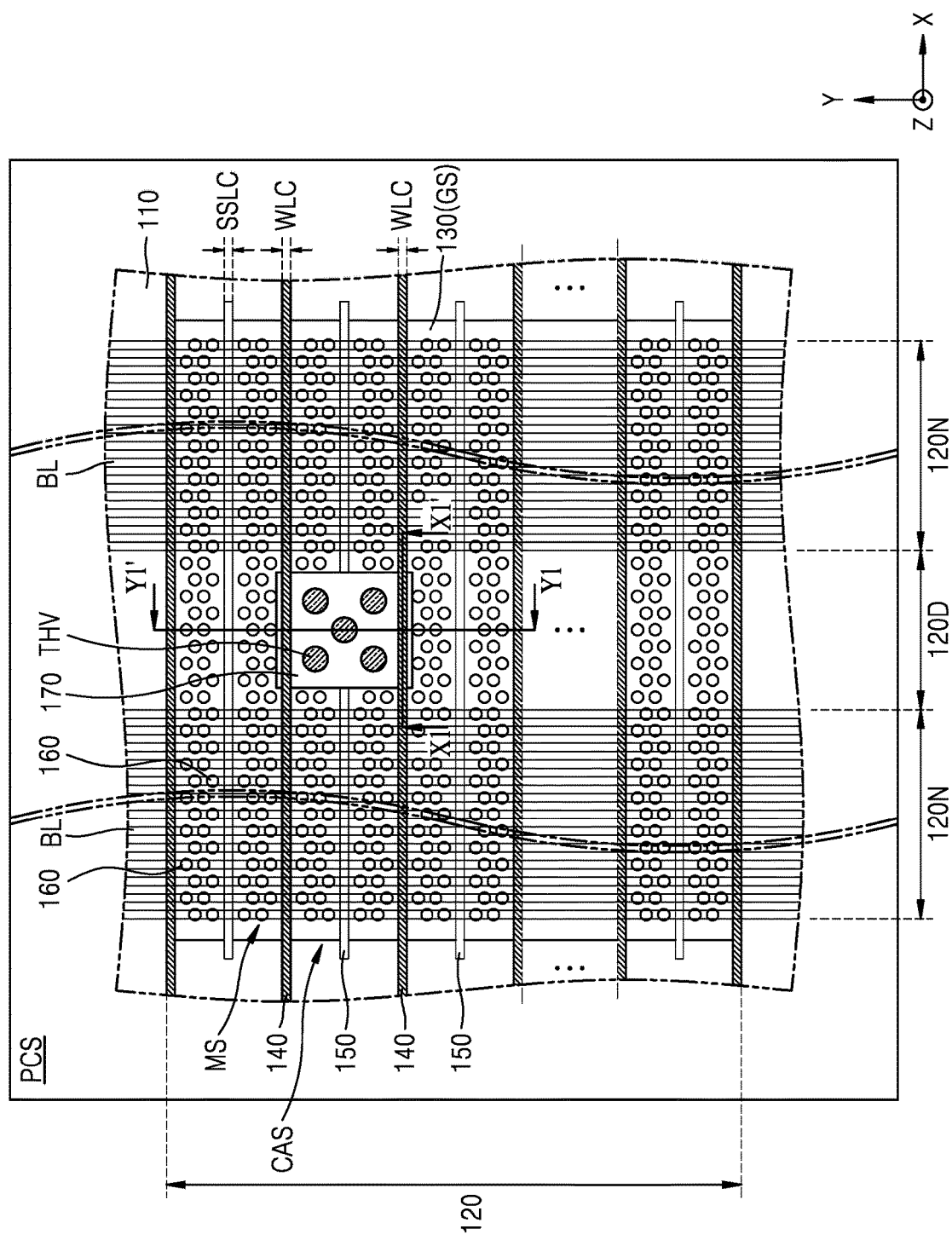
FIG. 4 is a schematic plan view of an IC device according to an embodiment.
Figure 5A:
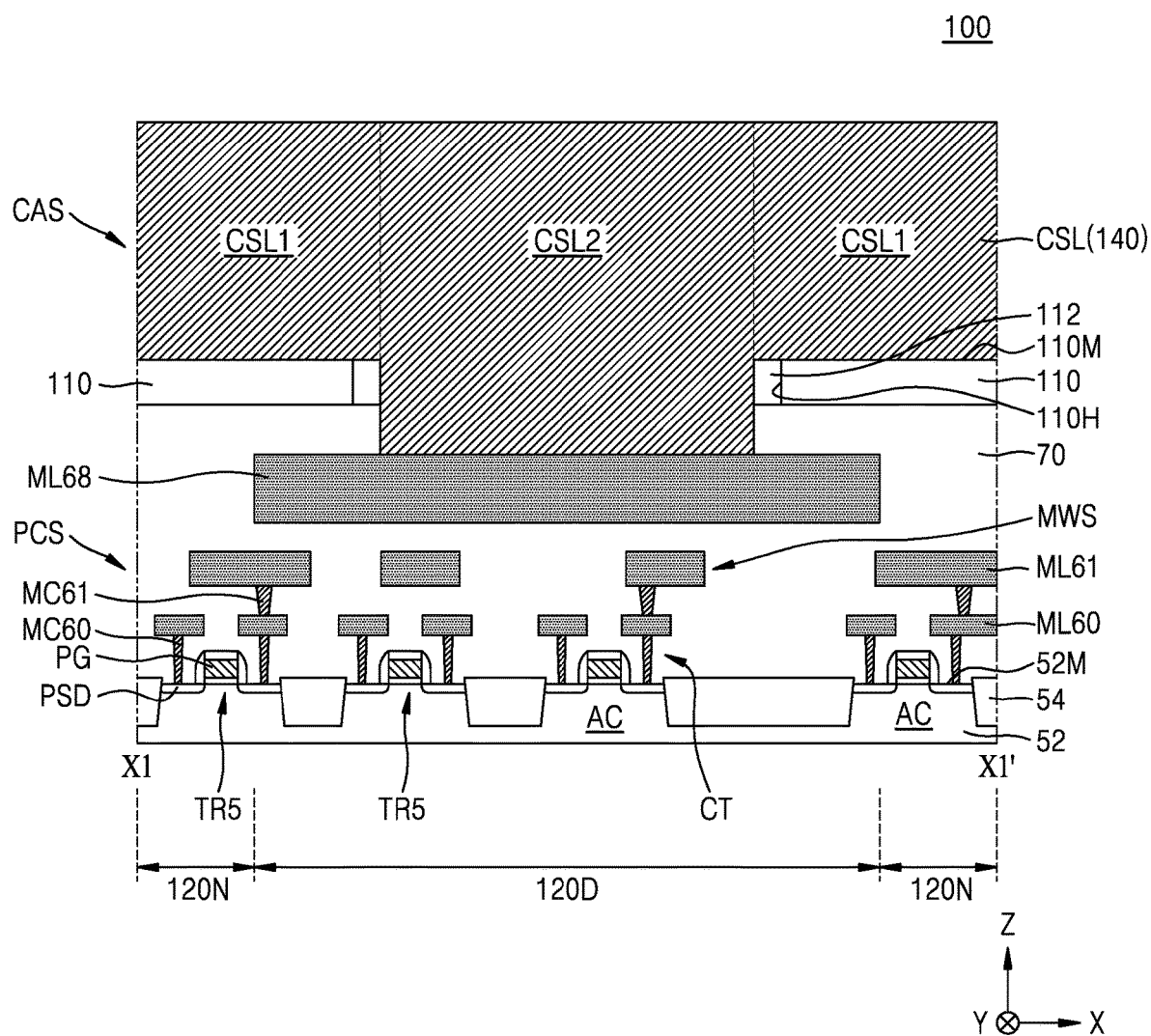
FIG. 5A is a cross-sectional view of some components taken along a line X1-X1' of FIG. 4.
Figure 5B:
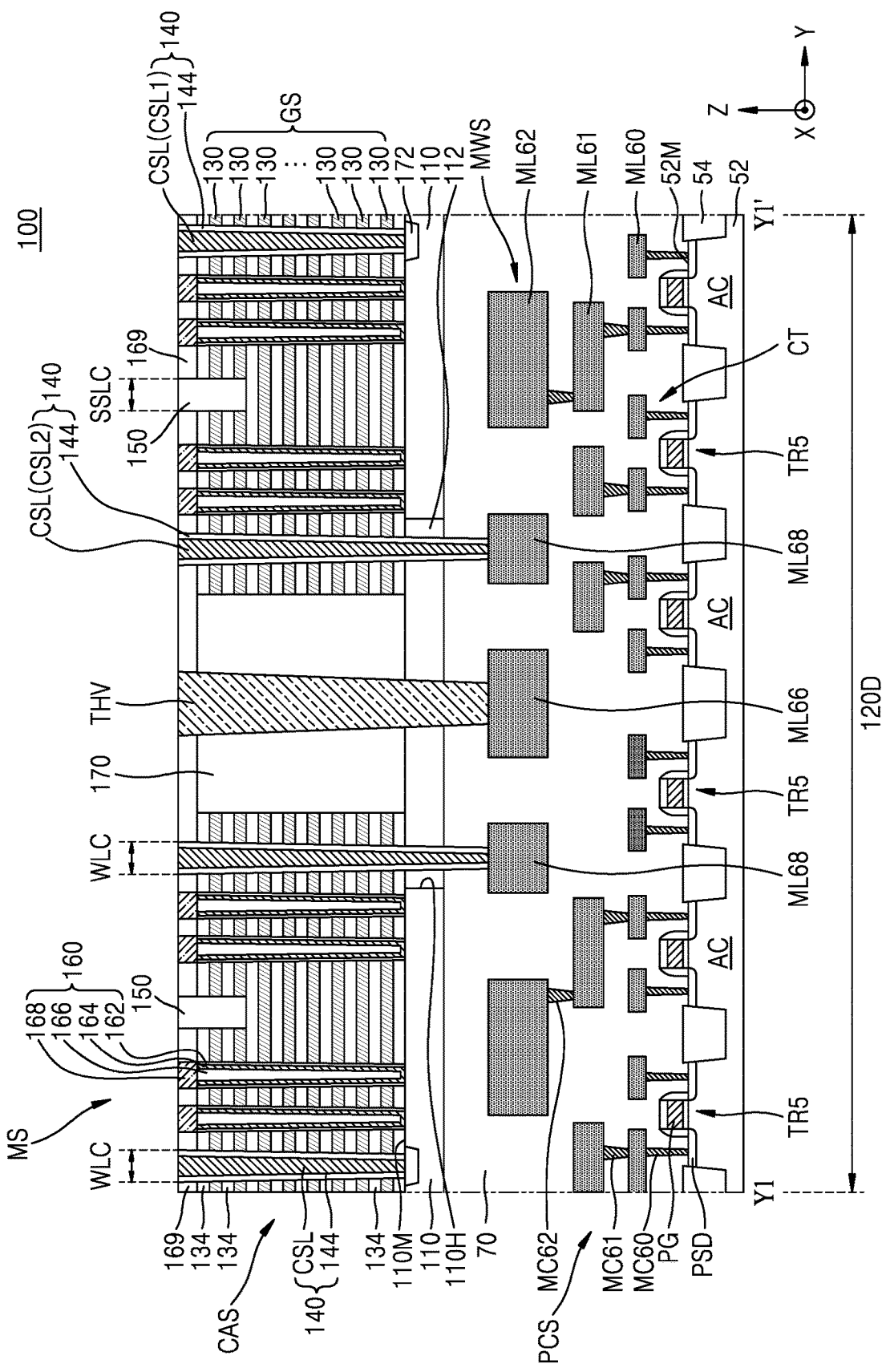
FIG. 5B is a cross-sectional view of some components taken along a line Y1-Y1' of FIG. 4.
Figure 5C:
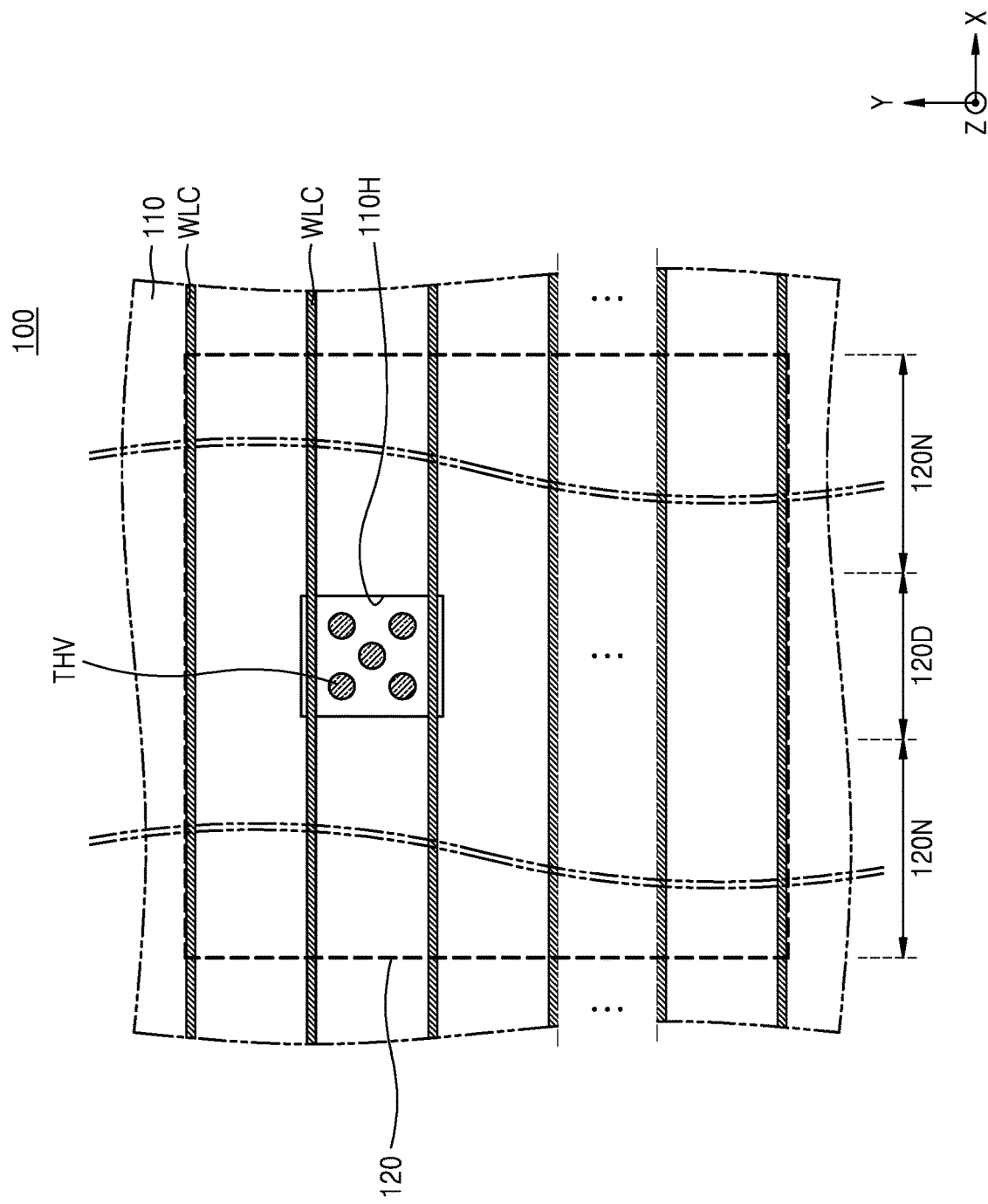
FIG. 5C is a plan view of some components of the IC device shown in FIG. 4.

FIG. 4 is a plan view of an IC device 100 according to an embodiment. FIG. 5A is a cross-sectional view of some components taken along a line X1-X1' of FIG. 4. FIG. 5B is a cross-sectional view of some components taken along a line Y1-Y1' of FIG. 4. FIG. 5C is a plan view of an upper substrate 110, a plurality of word line cut regions WLC, and a plurality of through electrodes THV of the IC device 100 shown in FIG. 4.

Referring to FIGS. 4 and 5A to 5C, the IC device 100 may constitute a portion of the IC device 10 described with reference to FIGS. 1 and 2. The IC device 100 may include a peripheral circuit structure PCS and a cell array structure CAS, which is arranged on the peripheral circuit structure PCS and overlaps the peripheral circuit structure PCS in a vertical direction (Z direction). The cell array structure CAS may include an upper substrate 110 formed on the peripheral circuit structure PCS and a memory stack MS located on the upper substrate 110. In example embodiments, the upper substrate 110 may include a semiconductor film. For example, the upper substrate 110 may include a polysilicon film.

The memory stack MS may include a memory cell region (refer to 120 in FIGS. 4 and 5C). The memory cell region 120 may include a plurality of memory cell blocks BLK1, BLK2, . . . , and BLKn described with reference to FIG. 2. The memory stack MS may include a plurality of gate stacks GS. Each of the plurality of gate stacks GS may include a plurality of gate lines 130, which extend parallel to each other in a lateral direction in the memory cell region 120 and overlap each other in the vertical direction (Z direction). Each of the plurality of gate lines 130 may include a metal, a metal silicide, a doped semiconductor, or a combination thereof. For example, each of the plurality of gate lines 130 may include a metal such as tungsten, nickel, cobalt, and tantalum; a metal silicide such as tungsten silicide, nickel silicide, cobalt silicide, and tantalum silicide; doped polysilicon; or a combination thereof.

An insulating film 134 may be between the upper substrate 110 and the plurality of gate lines 130 and between adjacent gate lines 130 of the plurality of gate lines 130. A top surface of an uppermost gate line 130 of the plurality of gate lines 130 may also be covered with the insulating film 134. The insulating film 134 may include, for example, silicon oxide.

As shown in FIG. 5B, a plurality of common source regions 172 may be formed in the upper substrate 110. The plurality of common source regions 172 may extend lengthwise in a first lateral direction (X direction). In example embodiments, the plurality of common source regions 172 may be impurity regions heavily doped with n-type impurities. The plurality of common source regions 172 may function as source regions configured to supply current to vertical memory cells. An item, layer, or portion of an item or layer described as extending "lengthwise" in a particular direction has a length in the particular direction and a width perpendicular to that direction, where the length is greater than the width.

The plurality of word line cut regions WLC, also described as word line separation regions, may intersect with the memory stack MS on the upper substrate 110 and extend in the first lateral direction (X direction). A width of the plurality of gate stacks GS in a second lateral direction (Y direction) may be defined by the plurality of word line cut regions WLC. The plurality of gate lines 130 may be spaced apart from each other (e.g., in the Y direction) by the plurality of word line cut regions WLC and may be arranged at regular intervals.

Each of the plurality of word line cut regions WLC may be filled with a common source line structure 140. The common source line structure 140 may include a common source line CSL and insulating spacers 144 covering sidewalls of the common source line CSL in the word line cut region WLC. Each of a plurality of common source lines CSL may include a metal such as tungsten, copper, or aluminum; a conductive metal nitride such as titanium nitride and tantalum nitride; a transitional metal such as titanium and tantalum; or a combination thereof. The insulating spacers 144 may include silicon oxide, silicon nitride, silicon oxynitride, or a low-k dielectric material. For example, the insulating spacers 144 may include a silicon oxide film, a silicon nitride film, silicon oxynitride (SiON), silicon oxycarbonitride (SiOCN), silicon carbonitride (SiCN), or a combination thereof.

The plurality of gate lines 130 included in one gate stack GS may be stacked on the upper substrate 110 to overlap each other in the vertical direction (Z direction) between two adjacent word line cut regions WLC. The plurality of gate lines 130 included in one gate stack GS may constitute the ground selection line GSL, the plurality of word lines WL, and the string selection line SSL, which are described with reference to FIG. 3. From among the plurality of gate lines 130 included in one gate stack GS, each of two uppermost gate lines 130 may be separated into two portions in the second lateral direction (Y direction) with a string selection line cut region SSLC therebetween. In the gate stack GS, the two portions of each of the two uppermost gate lines 130, which are separated from each other with the string selection line cut region SSLC therebetween, may each constitute the string selection lines SSL described with reference to FIG. 3. Although FIGS. 4 and 5B illustrate an example in which one string selection line cut region SSLC is formed in one gate stack GS, the inventive concept is not limited thereto.

For example, at least two string selection line cut regions SSLC may be formed in one gate stack GS. The string selection line cut region SSLC may be filled with an insulating film 150. The insulating film 150 may include an oxide film, a nitride film, or a combination thereof. In example embodiments, at least a portion of the string selection line cut region SSLC may be filled with an air gap.

A plurality of channel structures 160 may pass through the plurality of gate lines 130 and extend in the vertical direction (Z direction) in the memory cell region 120 on the upper substrate 110. The plurality of channel structures 160 may be arranged a predetermined distance apart from each other in the first lateral direction (X direction) and the second lateral direction (Y direction). Each of the plurality of channel structures 160 may include a gate dielectric film 162, a channel region 164, a buried insulating film 166, and a drain region 168. The gate dielectric film 162 may have a structure in which a tunneling dielectric film, a charge storage film, and a blocking dielectric film are sequentially formed on the channel region 164. The channel region 164 may include doped polysilicon or undoped polysilicon. The channel region 164 may have a cylindrical shape. An inner space of the channel region 164 may be filled with the buried insulating film 166. The buried insulating film 166 may include an insulating material. For example, the buried insulating film 166 may include silicon oxide, silicon nitride, silicon oxynitride, or a combination thereof. In some embodiments, the buried insulating film 166 may be omitted.

In this case, the channel region 164 may have a pillar structure having no inner space. The drain region 168 may include a doped polysilicon film. The plurality of drain regions 168 may be insulated from each other by an upper insulating film 169. The upper insulating film 169 may include an oxide film, a nitride film, or a combination thereof.

As shown in FIG. 4, in the cell array structure CAS, the memory cell region 120 may include a plurality of normal cell regions 120N and a dummy cell region 120D. An example in which the memory cell region 120 includes two normal cell regions 120N and one dummy cell region 120D is illustrated in FIG. 4. The dummy cell region 120D may extend in the second lateral direction (Y direction) between the two normal cell regions 120N. The two normal cell regions 120N may be spaced apart from each other with the dummy cell region 120D therebetween. However, the numbers and arrangements of the normal cell regions 120N and the dummy cell regions 120D are not limited to examples shown in FIG. 4 and may be variously modified and changed within the scope of the inventive concept.

In the normal cell region 120N, a plurality of bit lines BL are arranged on the plurality of channel structures 160. The plurality of bit lines BL may be arranged parallel to each other and extend lengthwise in the second lateral direction (Y direction). In the normal cell region 120N, each of the plurality of channel structures 160 may be connected to a corresponding one of the plurality of bit lines BL through a contact pad (not shown). From among the plurality of channel structures 160, a plurality of channel structures 160 arranged between the string selection line cut region SSLC and the word line cut region WLC in the normal cell region 120N may be normal channel structures. From among the plurality of channel structures 160, a channel structure (not shown) overlapping the string selection line cut region SSLC and a channel structure 160 arranged in the dummy cell region 120D may be a dummy channel structure. Dummy channel structures, as discussed herein, may have a similar or the same physical structure as normal channel structures, but they do not function as channels. For example, as discussed above and as shown in FIG. 4, in some embodiments, dummy channel structures are not connected to any bit lines, so bit line voltages cannot be applied to these structures, and these structures cannot be used to store data in the same way as normal channel structures.

As shown in FIGS. 5A to 5C, the upper substrate 110 may include a through hole 110H. The through hole 110H of the upper substrate 110 may be located below the memory cell region 120. The through hole 110H may be positioned below the dummy cell region 120D from among the memory cell regions 120. The through hole 110H may be filled with a buried insulating film 112. In example embodiments, the buried insulating film 112 may include a silicon oxide film.

In the dummy cell region 120D, an insulating structure 170 may be arranged on the upper substrate 110. The insulating structure 170 may pass through the plurality of gate lines 130 included in the gate stack GS and a plurality of insulating films 134 and extend in the vertical direction (Z direction). In example embodiments, the insulating structure 170 may include a silicon oxide film.

At least one of the plurality of word line cut regions WLC may intersect with the memory stack MS and the through hole 110H and extend lengthwise in the first lateral direction (X direction). The at least one word line cut region WLC may include a portion, which extends lengthwise in the first lateral direction (X direction) on a main surface 110M of the upper substrate 110, and a portion, which penetrates the upper substrate 110 through the through hole 110H formed in the upper substrate 110 in the vertical direction (Z direction).

As shown in FIGS. 5A and 5B, at least one of a plurality of common source lines CSL filling the plurality of word line cut regions WLC may include a first portion CSL1 and a second portion CSL2. The first portion CSL1 may extend lengthwise in the first lateral direction (X direction) on the main surface 110M of the upper substrate 110. The second portion CSL2 may be integrally connected to the first portion CSL1, for example to form a continuous material. The second portion CSL2 may penetrate the upper substrate 110 from an upper portion of the upper substrate 110 through the through hole 110H in the vertical direction (Z direction) and extend into the peripheral circuit structure PCS. In the common source line CSL, a length of the second portion CSL2 in the vertical direction (Z direction) may be greater than a length of the first portion CSL1 in the vertical direction (Z direction).

The second portion CSL2 of the common source line CSL may not overlap the upper substrate 110 in the vertical direction (Z direction). The second portion CSL2 of the common source line CSL may pass through the upper insulating film 169, the insulating structure 170, and the buried insulating film 112 and extend into the peripheral circuit structure PCS in the vertical direction (Z direction).

FIGS. 4 and 5A to 5C exemplarily illustrate a configuration in which each of two word line cut regions WLC includes a portion extending across the through hole 110H formed in the upper substrate 110, and each of two common source lines CSL filling the two word line cut regions WLC includes the second portion CSL2 penetrating the upper substrate 110 through the through hole 110H of the upper substrate 110. However, the inventive concept is not limited thereto. In example embodiments, only one of a plurality of word line cut regions WLC may extend across the through hole 110H formed in the upper substrate 110, and only one common source line CSL filling the one word line cut region WLC may include a second portion CSL2 that penetrates the upper substrate 110 through the through hole 110H and extends into the peripheral circuit structure PCS. In other example embodiments, at least three of a plurality of word line cut regions WLC may extend across the through hole 110H formed in the upper substrate 110, and at least three common source lines CSL filling the at least three word line cut regions WLC may include a second portion CSL2, which penetrates the upper substrate 110 through the through hole 110H and extends into the peripheral circuit structure PCS. The second portion CSL2 of the common source line CSL may be spaced apart from the upper substrate 110 with the buried insulating film 112 therebetween in the lateral direction.

In the dummy cell region 120D, the plurality of through electrodes THV may pass through the gate stack GS of the cell array structure CAS, penetrate the upper substrate 110 through the through hole 110H, and extend lengthwise into the peripheral circuit structure PCS in the vertical direction (Z direction). Each of the plurality of through electrodes THV may be surrounded by the upper insulating film 169 and the insulating structure 170 in the cell array structure CAS and surrounded by the buried insulating film 112 inside the through hole 110H of the upper substrate 110.

Although FIG. 5C illustrates only one through hole 110H formed in the upper substrate 110, a plurality of through holes 110H may be formed in the upper substrate 110. Although FIGS. 4 and 5C illustrate an example in which five through electrodes THV pass through one insulating structure 170 and one through hole 110H, the number of through electrodes THV, which pass through one insulating structure 170 and one through hole 110H, is not limited to the example shown in FIGS. 4 and 5C, and the number and size of through electrodes THV may be variously changed within the scope of the inventive concept.

As the number of stages of the gate lines 130 stacked in the vertical direction (Z direction) in the memory stack MS formed on the upper substrate 110 increases, design rules for ensuring a minimum separation distance between the plurality of through electrodes THV penetrating the upper substrate 110 through the through hole 110H and the upper substrate 110 may be more rigorous. A stable separation distance greater than or equal to a minimum separation distance required by the design rules may be ensured between the plurality of through electrodes THV penetrating the upper substrate 110 through the through hole 110H and the upper substrate 110. In example embodiments, there may be a separation distance, which is selected in the range of about 0.01 μm to about 1.5 μm, between the plurality of through electrodes THV, which penetrate the upper substrate 110 through the through hole 110H, and the upper substrate 110.

According to certain embodiments, the second portion CSL2 of the common source line CSL, which intersects with the through hole 110H and penetrates the upper substrate 110 through the through hole 110H, does not overlap the upper substrate 110 in the vertical direction (Z direction).

As shown in FIGS. 5A and 5B, the peripheral circuit structure PCS may include a lower substrate 52, a plurality of circuits CT formed on a main surface 52M of the lower substrate 52, and a multilayered interconnection structure MWS. Each of the plurality of through electrodes THV may be connected to at least one of the plurality of circuits CT through the multilayered interconnection structure MWS included in the peripheral circuit structure PCS, and may be connected between those circuits and a circuit or wiring line above the cell array structure CAS of the integrated circuit device 10 (e.g., to a controller).

The lower substrate 52 may include a semiconductor substrate. For example, the lower substrate 52 may include silicon (Si), germanium (Ge), or silicon germanium (SiGe). An active region AC may be defined by a device isolation film 54 in the lower substrate 52. The plurality of circuits CT may include various circuits included in the peripheral circuit 30 described with reference to FIG. 1. In example embodiments, the plurality of circuits CT may include unit elements, such as resistors and capacitors. A plurality of transistors TR5 included in the plurality of circuits CT may be formed on the active region AC. Each of the plurality of transistors TR5 may include a gate PG and source/drain regions PSD formed in the active region AC on both sides of the gate PG.

The multilayered interconnection structure MWS may include a plurality of peripheral circuit interconnection layers (e.g., ML60, ML61, ML62, and ML66) connected to the plurality of circuits CT, a plurality of peripheral circuit contacts (e.g., MC60, MC61, and MC62), and a floating interconnection layer ML68, which is spaced apart from the peripheral circuit interconnection layers ML60, ML61, ML62, and ML66 and the peripheral circuit contacts MC60, MC61, and MC62. The floating interconnection layer ML68 may be formed at the same level as uppermost peripheral circuit interconnection layers ML62 and ML66, which are closest to the upper substrate 110 from among the peripheral circuit interconnection layers ML60, ML61, ML62, and ML66. Here, a term "level" refers to a distance from a top surface of the lower substrate 52 in a vertical direction (Z direction or -Z direction). The peripheral circuit interconnection layers ML60, ML61, ML62, and ML66 may be referred to as peripheral circuit conductive interconnection patterns, and the floating interconnection layer ML68 may be referred to as a floating conductive interconnection pattern. The peripheral circuit conductive interconnection patterns and the floating conductive interconnection pattern may be formed at the same vertical layer of the multilayered interconnection structure MWS.

Some of the peripheral circuit interconnection layers ML60, ML61, ML62, and ML66 may be capable of being electrically connected to the plurality of transistors TR5. The peripheral circuit contacts MC60, MC61, and MC62 may connect some peripheral circuit interconnection layers (e.g., ML60, ML61, ML62, and ML66), which are selected out of the peripheral circuit interconnection layers ML60, ML61, ML62, and ML66. A lower end of each of the through electrodes THV may be connected to some peripheral circuit interconnection layers (e.g., ML66) of the uppermost peripheral circuit interconnection layers ML62 and ML66, which are closest to the upper substrate 110 from among the peripheral circuit interconnection layers ML60, ML61, ML62, and ML66. The second portion CSL2 of the common source line CSL, which penetrates the upper substrate 110 through the through hole 110H and extends into the peripheral circuit structure PCS, may be connected to the floating interconnection layer ML68. The floating interconnection layer ML68 may not be connected to a conductive material other than one common source line CSL that is in contact with a top surface of the floating interconnection layer ML68. The floating interconnection layer ML68 may be part of the peripheral circuit structure PCS, but may not contact any other conductive components of peripheral circuit structure PCS. The floating interconnection layer ML68 may be electrically isolated from circuitry disposed in peripheral circuit structure PCS. During an operation of the IC device 100, the floating interconnection layer ML68 may have the same electrical bias as one common source line CSL that is in contact with the top surface of the floating interconnection layer ML68.

Each of the plurality of peripheral circuit interconnection layers ML60, ML61, ML62, and ML66, the plurality of peripheral circuit contacts MC60, MC61, and MC62, and the floating interconnection layer ML68 may include conductive material such as a metal, a conductive metal nitride, a metal silicide, or a combination thereof. For example, each of the plurality of peripheral circuit interconnection layers ML60, ML61, ML62, and ML66, the plurality of peripheral circuit contacts MC60, MC61, and MC62, and the floating interconnection layer ML68 may include a conductive material, such as tungsten, molybdenum, titanium, cobalt, tantalum, nickel, tungsten silicide, titanium silicide, cobalt silicide, tantalum silicide, nickel silicide, or the like. Although FIGS. 5A and 5B illustrate an example in which the multilayered interconnection structure MWS includes three interconnection layers in the vertical direction (Z direction), the inventive concept is not limited to the example shown in FIGS. 5A and 5B. For example, the multilayered interconnection structure MWS may include two, four, or more interconnection layers.

The plurality of circuits CT, the peripheral circuit interconnection layers ML60, ML61, ML62, and ML66, the peripheral circuit contacts MC60, MC61, and MC62, and the floating interconnection layer ML68 may be covered by an interlayer insulating film 70. The plurality of through electrodes THV may pass through a portion of the interlayer insulating film 70 and contact a top surface of the peripheral circuit interconnection layer ML66. The term "contact" or "in contact with," as used herein, refers to a direct connection (e.g., touching). The second portion CSL2 of the common source line CSL, which penetrates the upper substrate 110 through the through hole 110H and extends into the peripheral circuit structure PCS, may pass through a portion of the interlayer insulating film 70 and contact the top surface of the floating interconnection layer ML68. The interlayer insulating film 70 may include silicon oxide, SiON, SiOCN, or the like.

Figure 6:
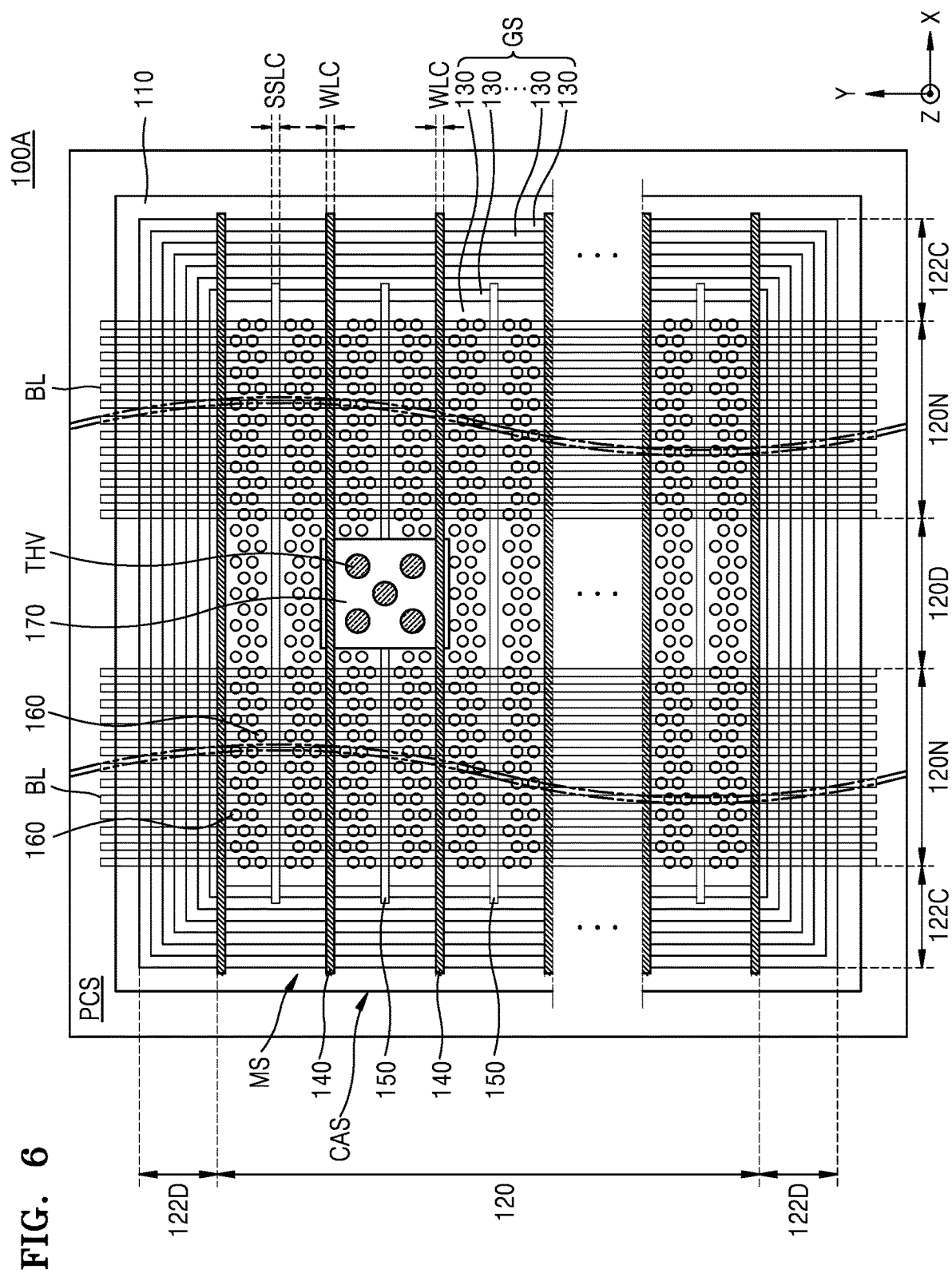
FIG. 6 is a schematic plan view of an IC device according to an embodiment.
Figure 7:
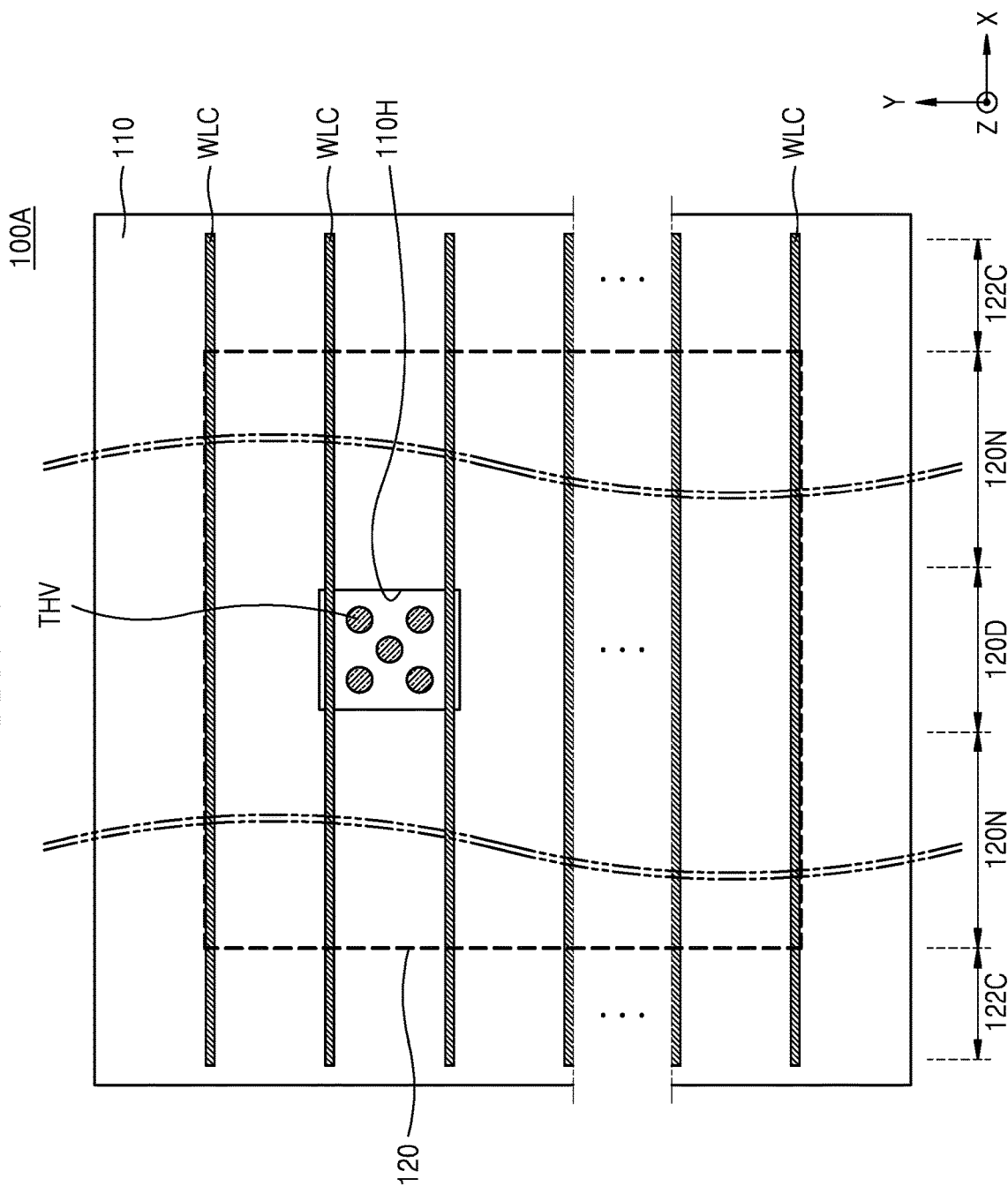
FIG. 7 is a plan view of some components of the IC device shown in FIG. 6.

FIG. 6 is a plan view of an IC device 100A according to an embodiment. FIG. 7 is a plan view of an upper substrate 110, a plurality of word line cut regions WLC, and a plurality of through electrodes THV of the IC device 100A shown in FIG. 6.

Referring to FIGS. 6 and 7, the IC device 100A may have substantially the same configuration as the IC device 100 described with reference to FIGS. 4 and 5A to 5C. However, the IC device 100A may include a pair of connection stepped regions 122C, which are respectively located on opposite sides of a memory cell region 120 in a first lateral direction (X direction), and a pair of dummy stepped regions 122D, which are respectively located on opposite sides of the memory cell region 120 in a second lateral direction (Y direction). In the pair of connection stepped regions 122C and the pair of dummy stepped regions 122D, widths of a plurality of gate lines 130 in the first lateral direction (X direction) and the second lateral direction (Y direction) may be gradually reduced in a direction away from the upper substrate 110. Each of the plurality of gate stacks GS may include the plurality of gate lines 130, which extend parallel in a lateral direction over the memory cell region 120 and the connection stepped regions 122C and overlap each other in a vertical direction (Z direction).

Figure 8:
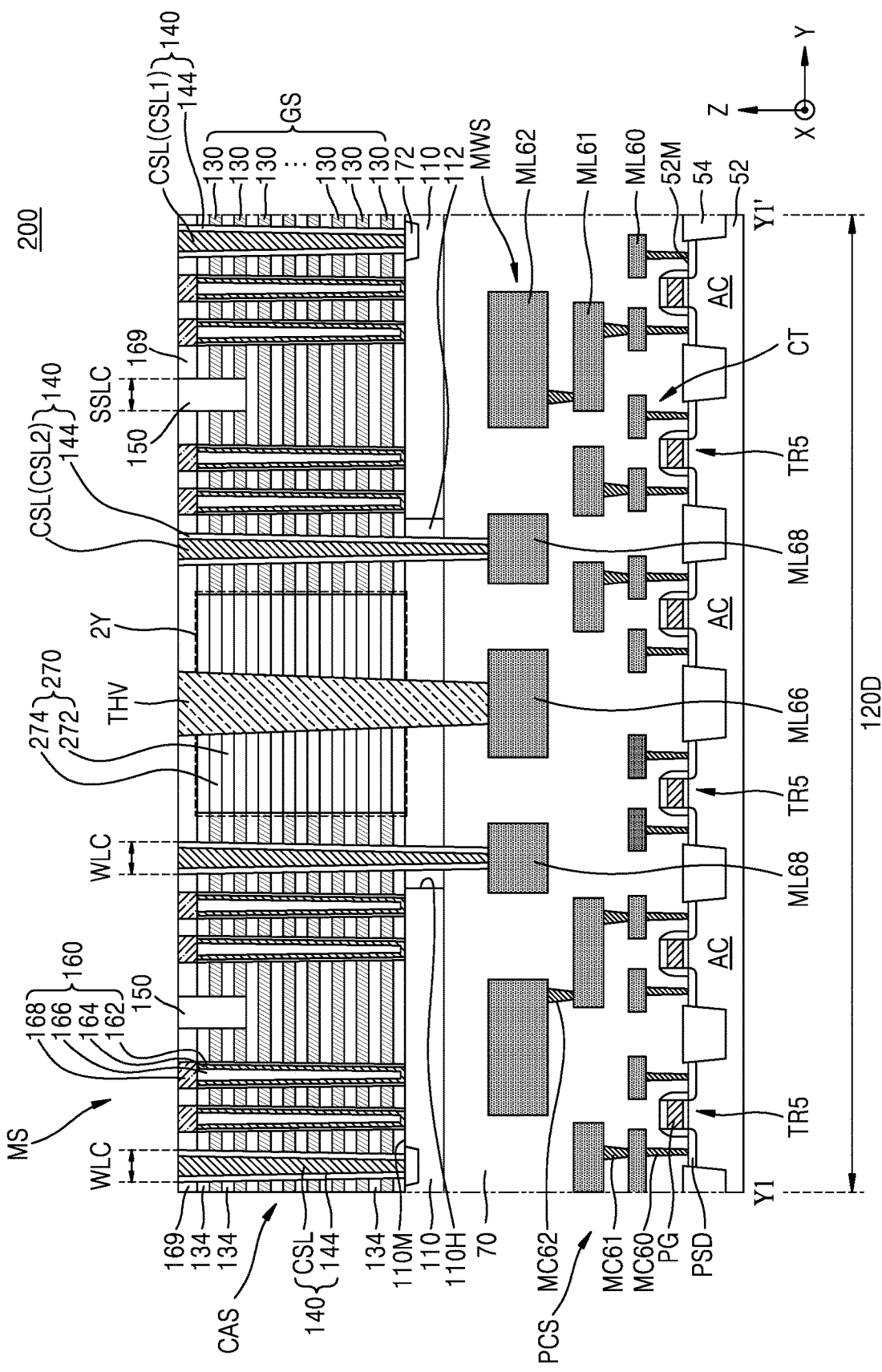
FIG. 8 is a cross-sectional view of an IC device according to an embodiment.

FIG. 8 is a cross-sectional view of an IC device 200 according to an embodiment. A sectional configuration of some components of a region corresponding to a cross-section taken along line Y1-Y1' of FIG. 4 is illustrated in FIG. 8.

Referring to FIG. 8, the IC device 200 may have substantially the same configuration as the IC device 100 described with reference to FIGS. 4 and 5A to 5C. However, the IC device 200 may include an insulating structure 270 instead of the insulating structure 170. The insulating structure 270 may overlap a buried insulating film 112 filling a through hole 110H of an upper substrate 110 in a vertical direction (Z direction). The insulating structure 270 may correspond to a dashed line region 2Y in FIG. 8. The insulating structure 270 may have a multilayered structure including a plurality of first insulating films 272 and a plurality of second insulating films 274, which are alternately stacked one by one on the buried insulating film 112. The plurality of first insulating films 272 may include the same material as a material included in an insulating film 134. The plurality of second insulating films 274 may include a material different from the material included in the insulating film 134. For example, the plurality of first insulating films 272 may include a silicon oxide film, and the plurality of second insulating films 274 may include a silicon nitride film. A top surface of the insulating structure 270 may be covered by an upper insulating film 169.

Figure 9:
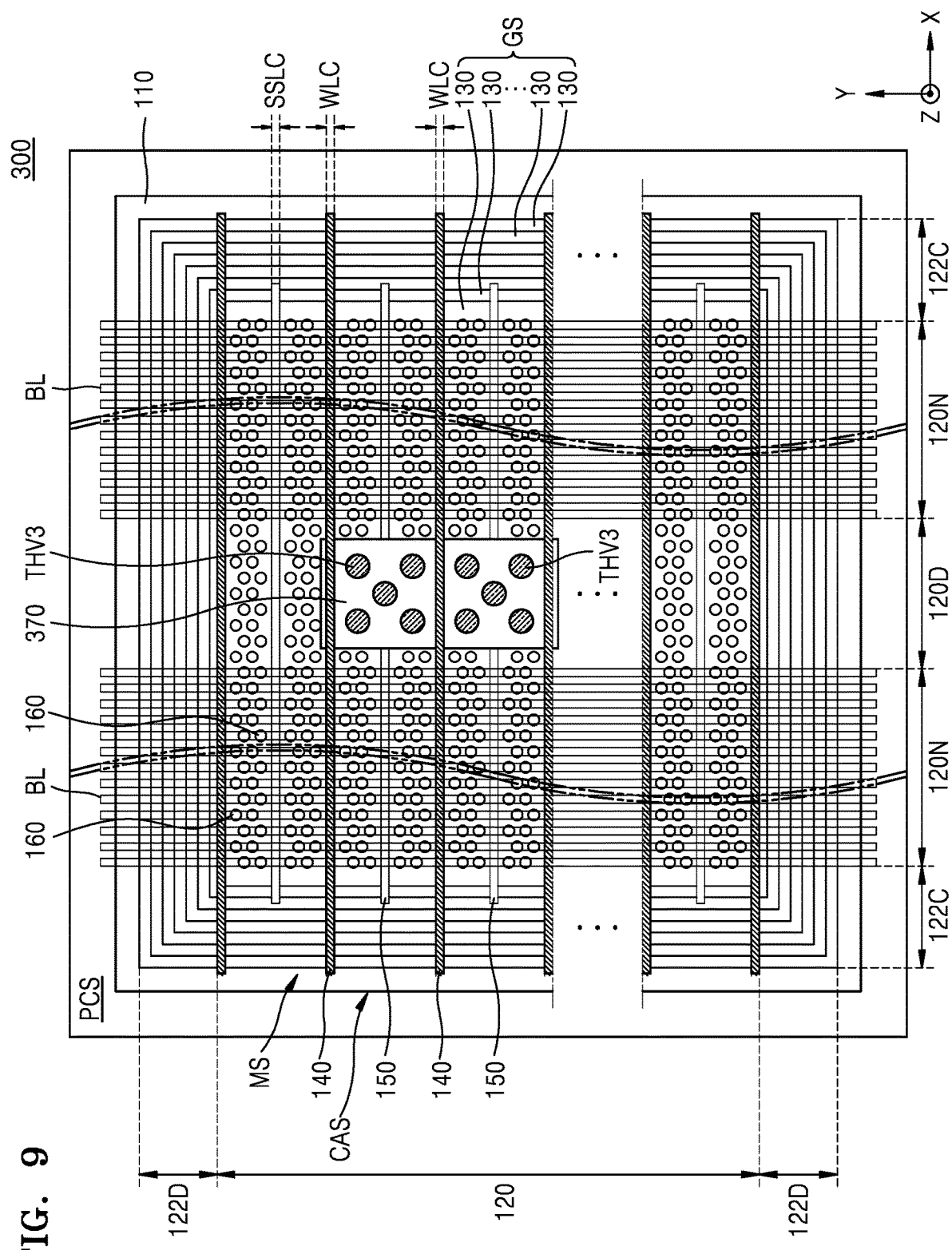
FIG. 9 is a plan view of an IC device according to an embodiment.
Figure 10:
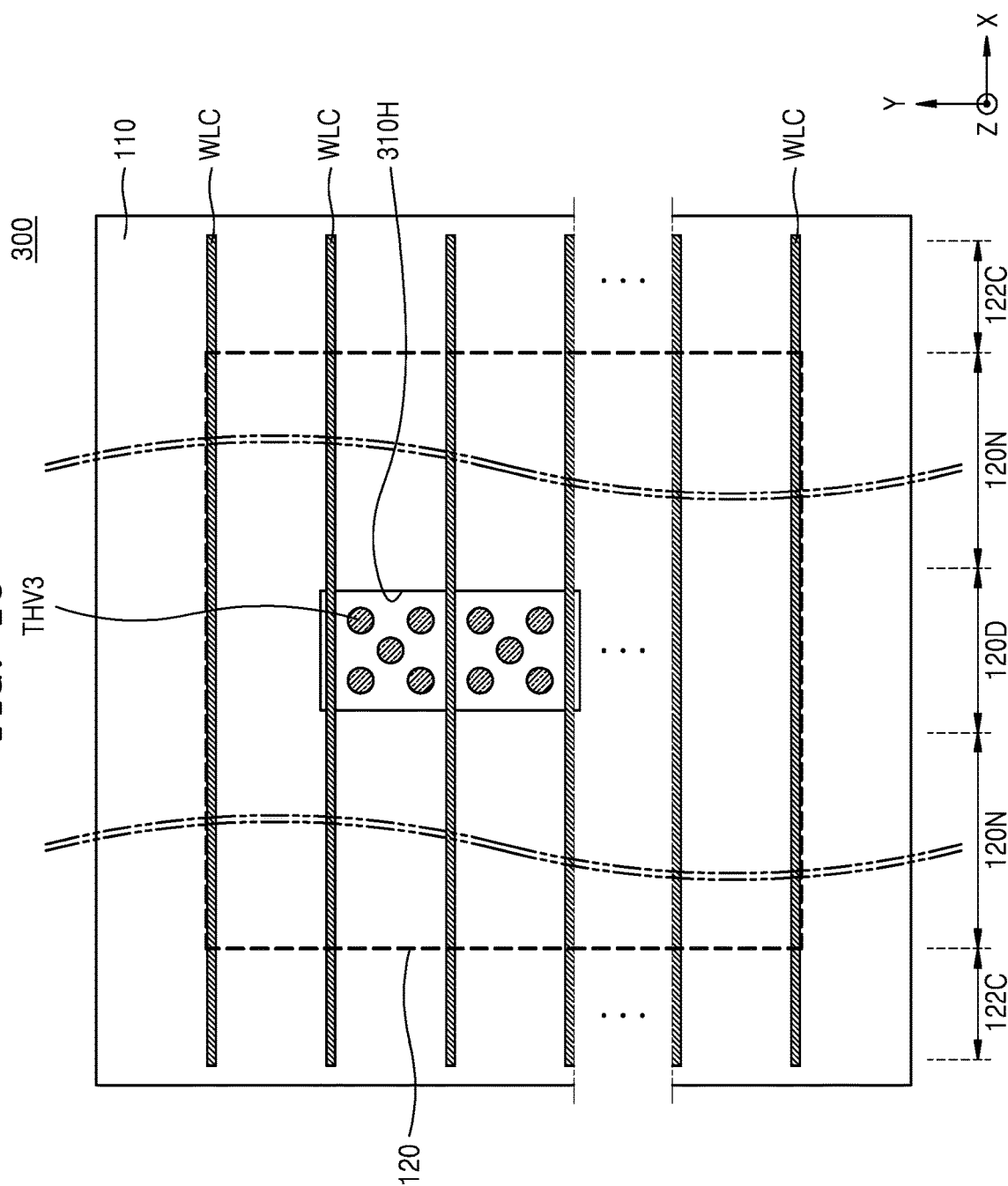
FIG. 10 is a plan view of some components of the IC device shown in FIG. 9.

FIG. 9 is a plan view of an IC device 300 according to an embodiment. FIG. 10 is a plan view of an upper substrate 110, a plurality of word line cut regions WLC, and a plurality of through electrodes THV3 of the IC device 300 shown in FIG. 9.

Referring to FIGS. 9 and 10, the IC device 300 may have substantially the same configuration as the IC device 100A described with reference to FIGS. 6 and 7. However, a through hole 310H may be formed in the upper substrate 110 at a position with a dummy cell region 120D of a memory cell region 120 of the IC device 300. The through hole 310H may intersect with at least two gate stacks GS and extend in a second lateral direction (Y direction).

An insulating structure 370 may be located on the upper substrate 110 at a position overlapping the through hole 310H in a vertical direction (Z direction). The insulating structure 370 may have the same configuration as the insulating structure 170 described with reference to FIGS. 4 and 5B or the insulating structure 270 described with reference to FIG. 8.

Three of a plurality of word line cut regions WLC may intersect with the through hole 310H formed in the upper substrate 110 and extend in a first lateral direction (X direction).

The IC device 300 may include a plurality of through electrodes THV3, which extend in the vertical direction (Z direction) through the through hole 310H. Similarly to the through electrode THV shown in FIG. 5B, each of the plurality of through electrodes THV3 may pass through a plurality of gate lines 130 in the dummy cell region 120D, penetrate the upper substrate 110 through the through hole 310H, and extend lengthwise into a peripheral circuit structure PCS in the vertical direction (Z direction). The upper substrate 110 may not be interposed between the respective through electrodes THV3. Some of the plurality of through electrodes THV3 may be spaced apart from each other with one word line cut region WLC therebetween.

Each of the plurality of through electrodes THV3 may be surrounded by the insulating structure 370 in a cell array structure CAS. Similarly to the through electrode THV shown in FIG. 5B, the plurality of through electrodes THV3 may be connected to at least one of a plurality of circuits CT through a peripheral circuit interconnection layer ML66 in the peripheral circuit structure PCS.

The plurality of through electrodes THV3 may include two through electrodes THV3, which are spaced apart from each other with one word line cut region WLC intersecting with the through hole 310H therebetween. Some of the plurality of through electrodes THV3 that pass through the through hole 310H may be spaced apart from other through electrodes THV3 with a second portion (refer to CSL2 in FIG. 5A) of one common source line CSL intersecting with the through hole 310H therebetween. Since the second portion CSL2 of the common source line CSL does not overlap the upper substrate 110 in the vertical direction (Z direction), it may be easy to ensure a stable separation distance greater than or equal to a minimum separation distance required by the design rules between the upper substrate 110 and the plurality of through electrodes THV3. Accordingly, a degree of freedom for layout design of the plurality of through electrodes THV3 that pass through one through hole 310H may be improved.

Although FIG. 10 illustrates an example in which one through hole 310H is formed in the upper substrate 110, a plurality of through holes 310H may be formed in the upper substrate 110. The number of through electrodes THV3 that pass through the one through hole 310H is not limited to the example shown in FIGS. 9 and 10 and may be variously changed within the scope of the inventive concept.

Figure 11:
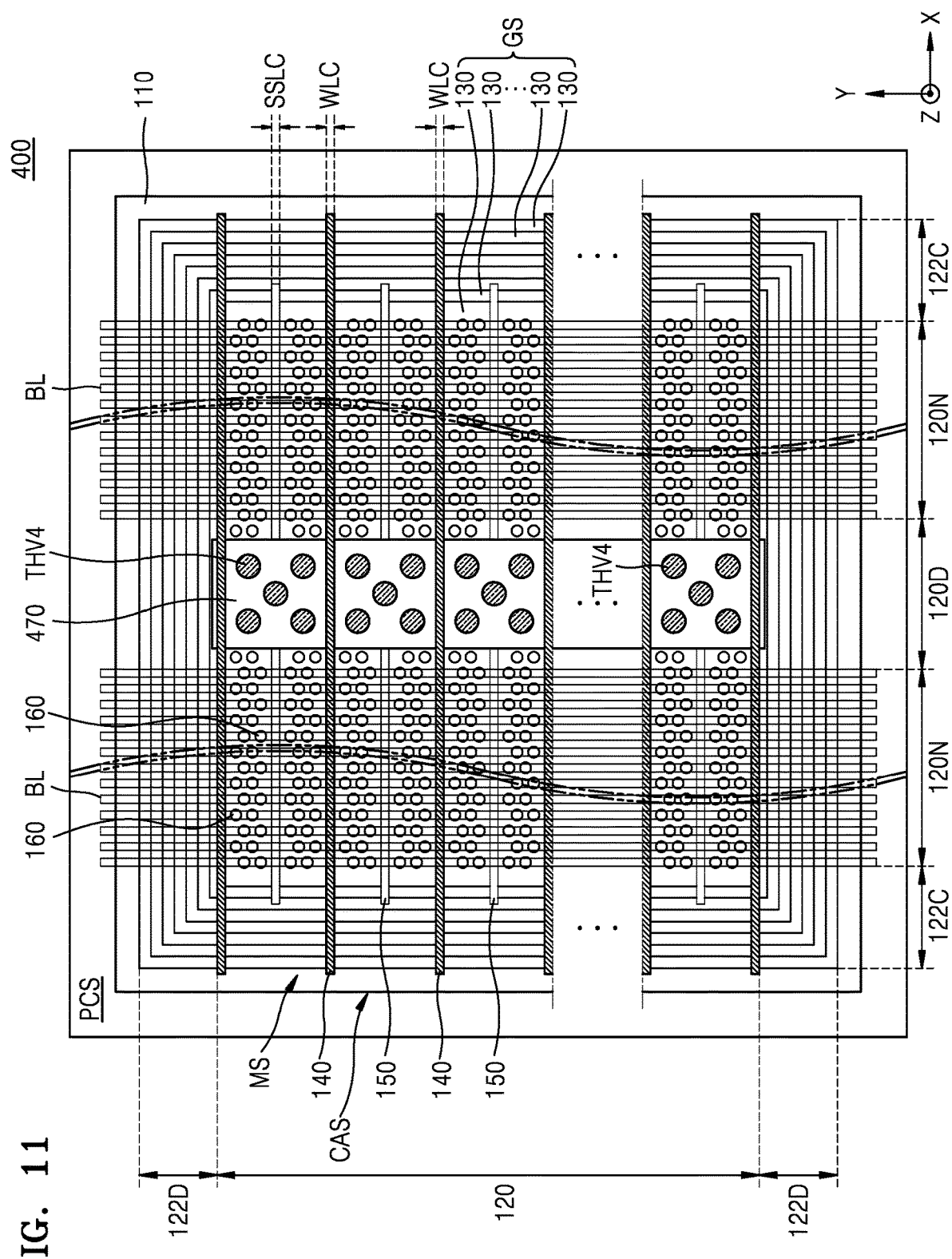
FIG. 11 is a plan view of an IC device according to an embodiment.
Figure 12:
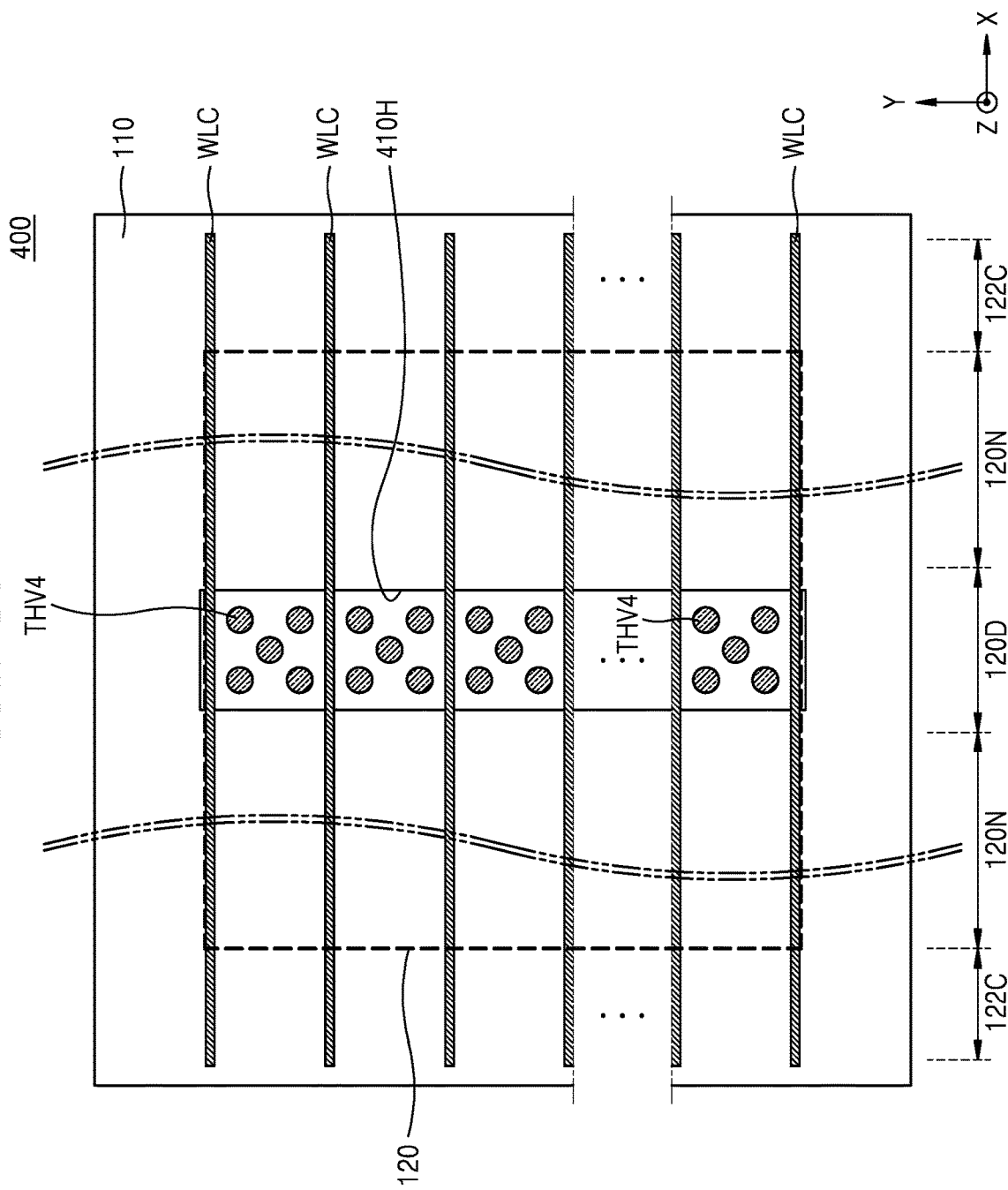
FIG. 12 is a plan view of some components of the IC device shown in FIG. 11.

FIG. 11 is a plan view of an IC device 400 according to an embodiment. FIG. 12 is a plan view of the upper substrate 110, the plurality of word line cut regions WLC, and a plurality of through electrodes THV4 of the IC device 400 shown in FIG. 11.

Referring to FIGS. 11 and 12, the IC device 400 may have substantially the same configuration as the IC device 100A described with reference to FIGS. 6 and 7. However, a through hole 410H may be formed in the upper substrate 110 in a dummy cell region 120D of a memory cell region 120 of the IC device 400. The through hole 410H may cross over the memory cell region 120 and extend lengthwise in a second lateral direction (Y direction). The memory cell region 120 may include two normal cell regions 120N, which are separated from each other by the through hole 410H.

An insulating structure 470 may be arranged on the upper substrate 110 at a position overlapping the through hole 410H in a vertical direction (Z direction). The insulating structure 470 may have the same configuration as the insulating structure 170 described with reference to FIGS. 4 and 5B or the insulating structure 270 described with reference to FIG. 8.

The plurality of word line cut regions WLC located on the upper substrate 110 may all intersect with the through hole 410H formed in the upper substrate 110 and extend in a first lateral direction (X direction).

The IC device 400 may include the plurality of through electrodes THV4, which extend in the vertical direction (Z direction) through the through hole 410H. Similarly to the through electrode THV shown in FIG. 5B, each of the plurality of through electrodes THV4 may pass through a plurality of gate lines 130 in the dummy cell region 120D, penetrate the upper substrate 110 through the through hole 410H, and extend lengthwise into a peripheral circuit structure PCS in the vertical direction (Z direction). The upper substrate 110 may not be interposed between each of the plurality of through electrodes THV4.

Each of the plurality of through electrodes THV4 may be surrounded by the insulating structure 470 in a cell array structure CAS. Similarly to the through electrode THV shown in FIG. 5B, the plurality of through electrodes THV4 may be connected to at least one of a plurality of circuits through a peripheral circuit interconnection layer ML66 included in the peripheral circuit structure PCS.

The plurality of through electrodes THV4 may include two through electrodes THV4, which are spaced apart from each other with one word line cut region WLC intersecting with the through hole 410H therebetween. Some of the plurality of through electrodes THV4 that pass through the through hole 410H may be spaced apart from other through electrodes THV4 with a second portion (refer to CSL2 in FIG. 5A) of one common source line CSL intersecting with the through hole 410H therebetween. Since the second portion CSL2 of the common source line CSL does not overlap the upper substrate 110 in the vertical direction (Z direction), it may be easy to ensure a stable separation distance greater than or equal to a minimum separation distance required by the design rules between the upper substrate 110 and the plurality of through electrodes THV4. Accordingly, a degree of freedom for layout design of the plurality of through electrodes THV4 that pass through one through hole 410H may be improved.

The number of through electrodes THV4 passing through the insulating structure 470 and the through hole 410H is not limited to the example shown in FIGS. 11 and 12, and the number and size of through electrodes THV4 may be variously changed within the scope of the inventive concept.

Figure 13:
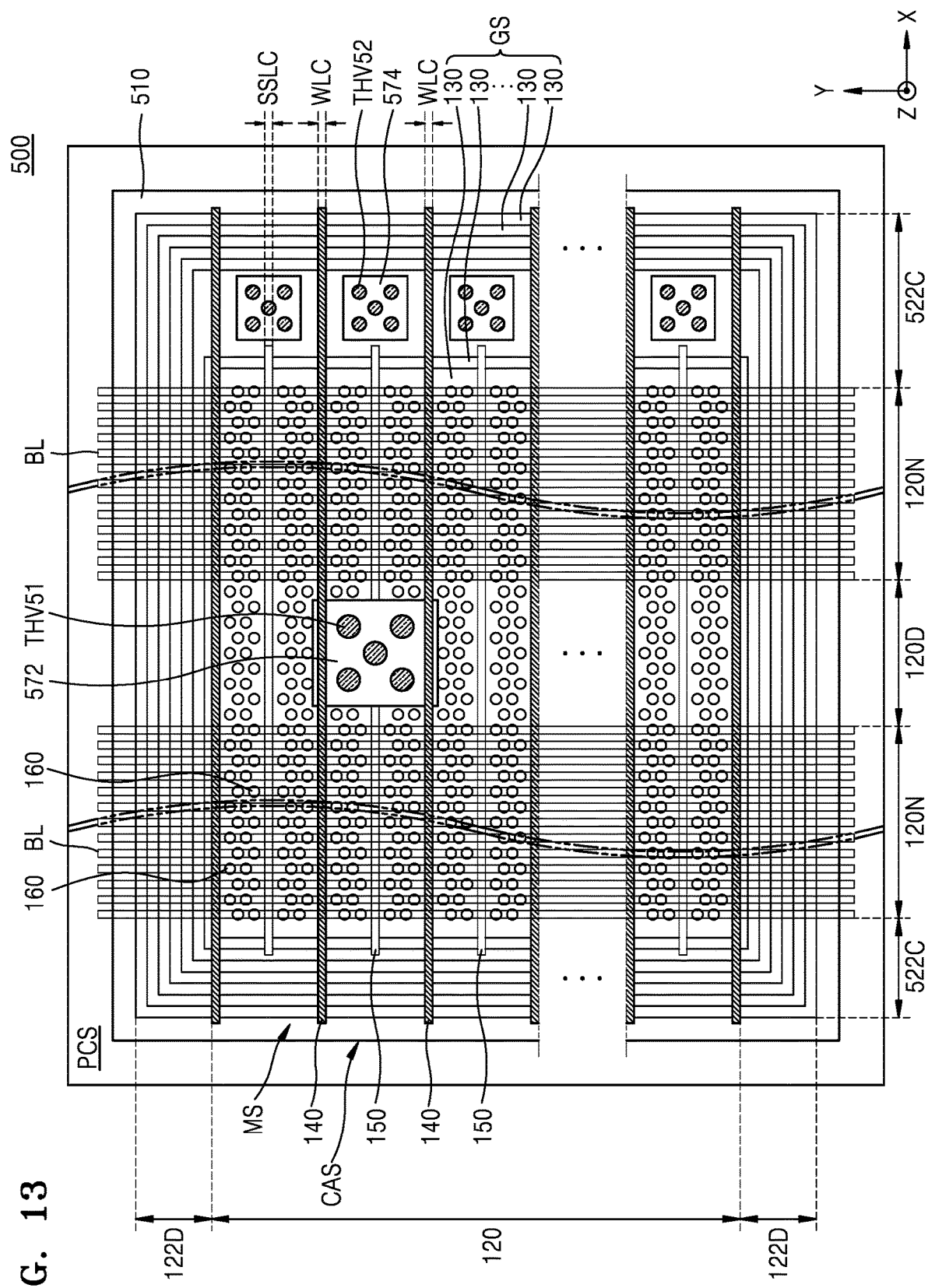
FIG. 13 is a plan view of an IC device according to an embodiment.
Figure 14:
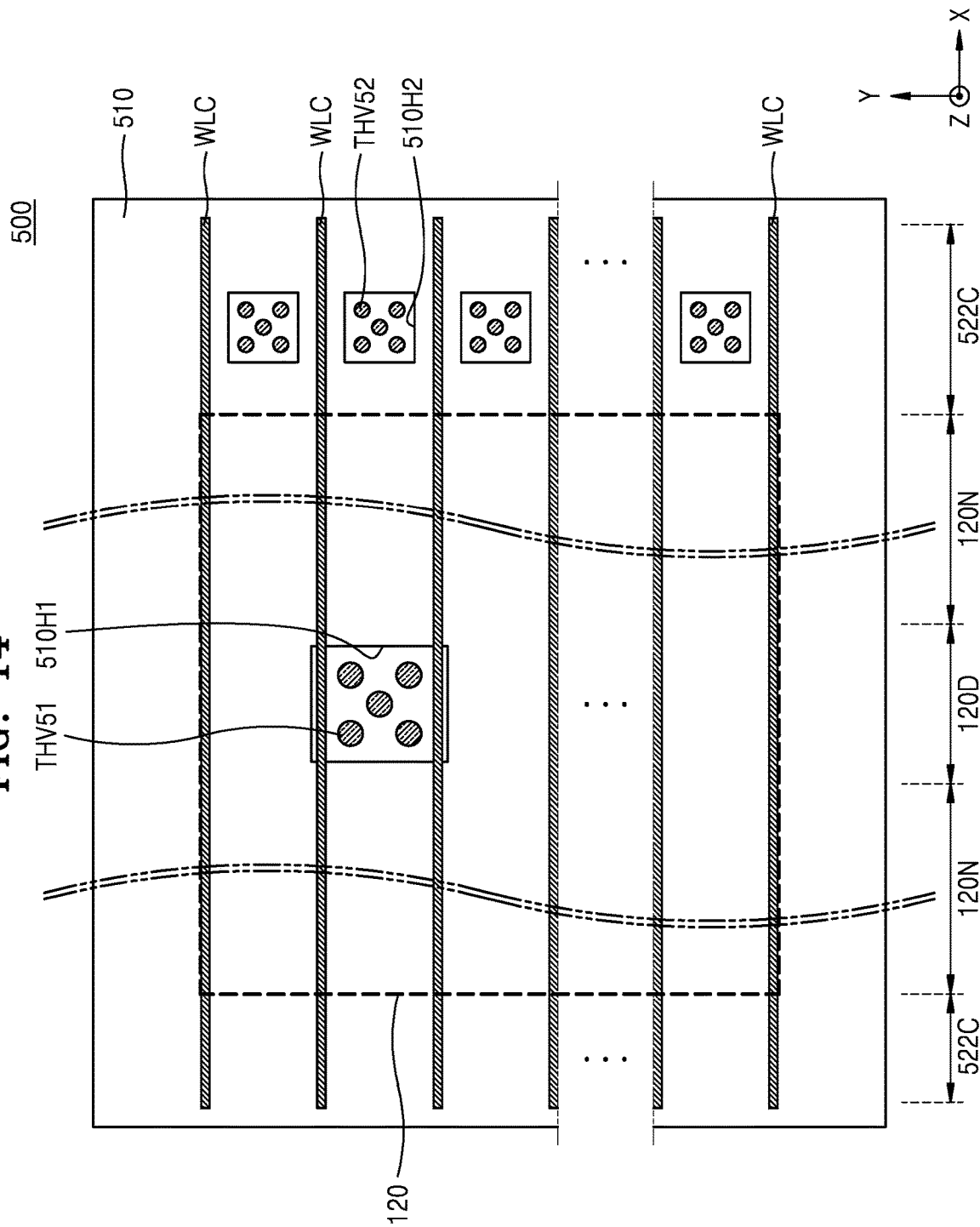
FIG. 14 is a plan view of some components of the IC device shown in FIG. 13.

FIG. 13 is a plan view of an IC device 500 according to an embodiment. FIG. 14 is a plan view of the upper substrate 110, the plurality of word line cut regions WLC, the plurality of first through electrodes THV51, and the plurality of first through electrodes THV52 of the IC device 300 shown in FIG. 13.

Referring to FIGS. 13 and 14, the IC device 500 may have substantially the same configuration as the IC device 100A described with reference to FIGS. 6 and 7. However, the IC device 500 may include a pair of connection stepped regions 522C, which are located on opposite sides of a memory cell region 120 in a first lateral direction (X direction).

A first through hole 510H1 may be formed in an upper substrate 510 at a position facing a dummy cell region 120D of the memory cell region 120. A plurality of second through holes 510H2 may be formed in the upper substrate 510 in at least one of the pair of connection stepped regions 522C. Although FIGS. 13 and 14 illustrate an example in which the plurality of second through holes 510H2 are formed in only one of the pair of connection stepped regions 522C, the inventive concept is not limited thereto, and a plurality of second through holes 510H2 may be formed in each of the pair of connection stepped regions 522C.

A first insulating structure 572 may be located on the upper substrate 510 at a position overlapping the first through hole 510H1 in a vertical direction (Z direction), and a second insulating structure 574 may be located at each of a plurality of positions overlapping the plurality of second through holes 510H2 in the vertical direction (Z direction). In example embodiments, the upper substrate 510, the first insulating structure 572, and the second insulating structure 574 may have the same configurations as the upper substrate 110 and the insulating structure 170 described with reference to FIGS. 4 and 5A to 5C. In other example embodiments, each of the first insulating structure 572 and the second insulating structure 574 may have the same configuration as the insulating structure 270 described with reference to FIG. 8.

The IC device 500 may include a plurality of first through electrodes THV51, which pass through a plurality of gate lines 130 in the dummy cell region 120D, penetrate the upper substrate 510 through the first through hole 510H1, and extend long into a peripheral circuit structure PCS in the vertical direction (Z direction). Also, the IC device 500 may include a plurality of second through electrodes THV52, which pass through the plurality of gate lines 130 in the connection stepped region 522C, penetrate the upper substrate 510 through the second through hole 510H2, and extend lengthwise into the peripheral circuit structure PCS in the vertical direction (Z direction).

Each of the plurality of first through electrodes THV51 may be surrounded by the first insulating structure 572 in a cell array structure CAS. Each of the plurality of second through electrodes THV52 may be surrounded by the second insulating structure 574 in the connection stepped region 522C. Similarly to the through electrode THV shown in FIG. 5B, each of the plurality of first through electrodes THV51 and the plurality of second through electrodes THV52 may be connected to at least one of a plurality of circuits CT through a peripheral circuit interconnection layer ML66 included in the peripheral circuit structure PCS.

The number of first through electrodes THV51 passing through one first through hole 510H1 is not limited to the example shown in FIGS. 13 and 14, and the number and size of first through electrodes THV51 may be variously changed within the scope of the inventive concept.

According to the IC devices 100, 100A, 200, 300, 400, and 500 described with reference to FIGS. 4 to 14, in the IC device having the COP structure, even if the number of stages of the gate lines 130 included in a memory stack MS stacked on the peripheral circuit structure PCS is increased and a height of the memory stack MS is increased, it may be easy to ensure a stable separation distance greater than or equal to a minimum separation distance required by the design rules between the upper substrate 110, which is interposed between the peripheral circuit structure PCS and the memory stack MS, and the through electrodes THV, THV3, or THV4, which pass through the memory stack MS and the upper substrate 110 and extend into the peripheral circuit structure PCS, or between the upper substrate 510 and the first through electrodes THV51, which pass through the memory stack MS and the upper substrate 510 and extend into the peripheral circuit structure PCS, a degree of freedom for layout design of the through electrodes THV, THV3, THV4, or THV51, which pass through the upper substrate 110 or 510, may be improved. Accordingly, the integration density of the IC device having the COP structure may be improved, a chip size may be reduced, and the reliability of the IC device may be improved.

As can be seen, the through electrodes THV, THV3, THV4, and THV51 described herein have structures where a continuous material extends from a bottom of the through electrodes (e.g., where they connect to and contact a conductive layer within peripheral circuit structure), to a top of the through electrodes (e.g., where they connect to a component above and outside of the cell array structure). These through electrodes may have continuous sidewalls from a bottom to top, and may be formed of a single integrated structure.

FIGS. 15A to 19A and 15B to 19B are cross-sectional views illustrating a process sequence of a method of manufacturing an IC device according to an embodiment. Specifically, FIGS. 15A-19A are cross-sectional views of some components according to the process sequence in a portion corresponding to a cross-section taken along a line X1-X1' of FIG. 4. FIGS. 15B-19B are cross-sectional views of some components according to the process sequence in the portion corresponding to a cross-section taken along a line Y1-Y1' of FIG. 4. In the present embodiment, a method of manufacturing the IC device 100 shown in FIGS. 4 and 5A to 5C will be described as an example.

Figure 15A:
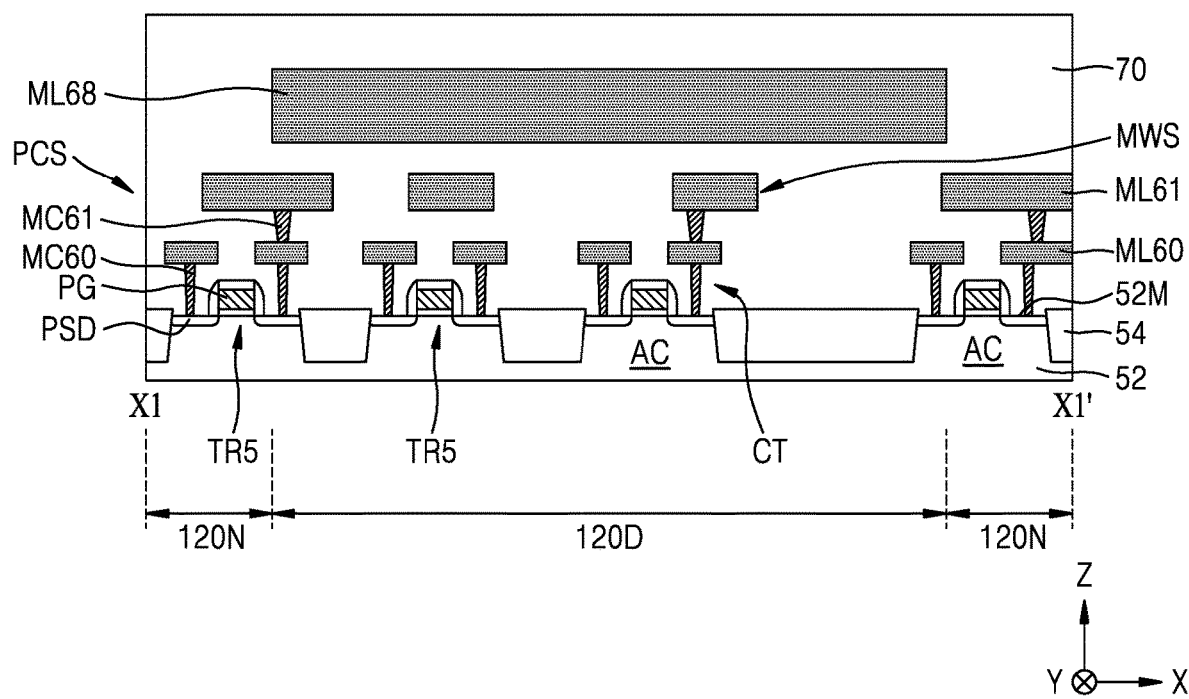
Figure 15B:
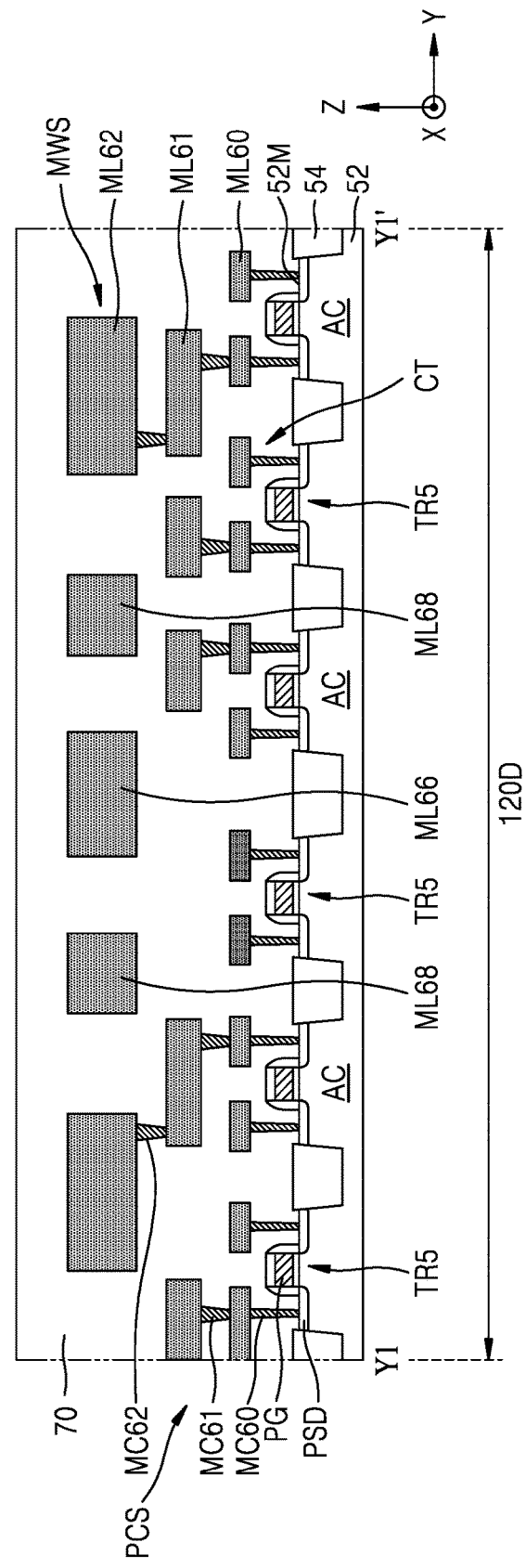

Referring to FIGS. 15A and 15B, a peripheral circuit structure PCS including a lower substrate 52, a plurality of circuits CT, a multilayered interconnection structure MWS, and an interlayer insulating film 70 are formed.

The multilayered interconnection structure MWS may include a plurality of peripheral circuit interconnection layers (e.g., ML60, ML61, ML62, and ML66) and a floating interconnection layer ML68, which is formed at the same level as uppermost peripheral circuit interconnection layers ML62 and ML66, which are closest to an upper substrate 110 from among the peripheral circuit interconnection layers ML60, ML61, ML62, and ML66. Each of these layers may be part of the same vertical layer of the multilayered interconnection structure MWS. For example, they may be formed as a unitary layer (e.g., a layer having a uniform material and formed during the same process at the same vertical level).

Figure 16A:
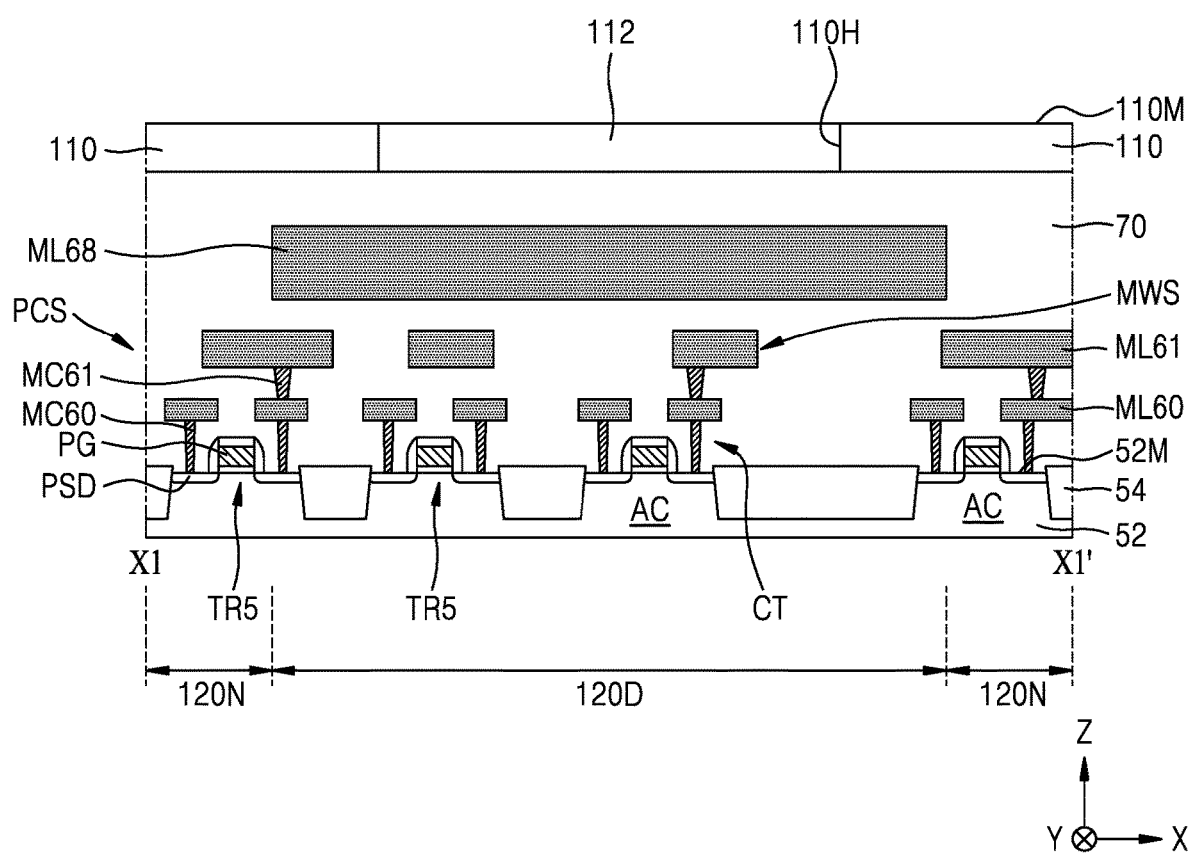
Figure 16B:
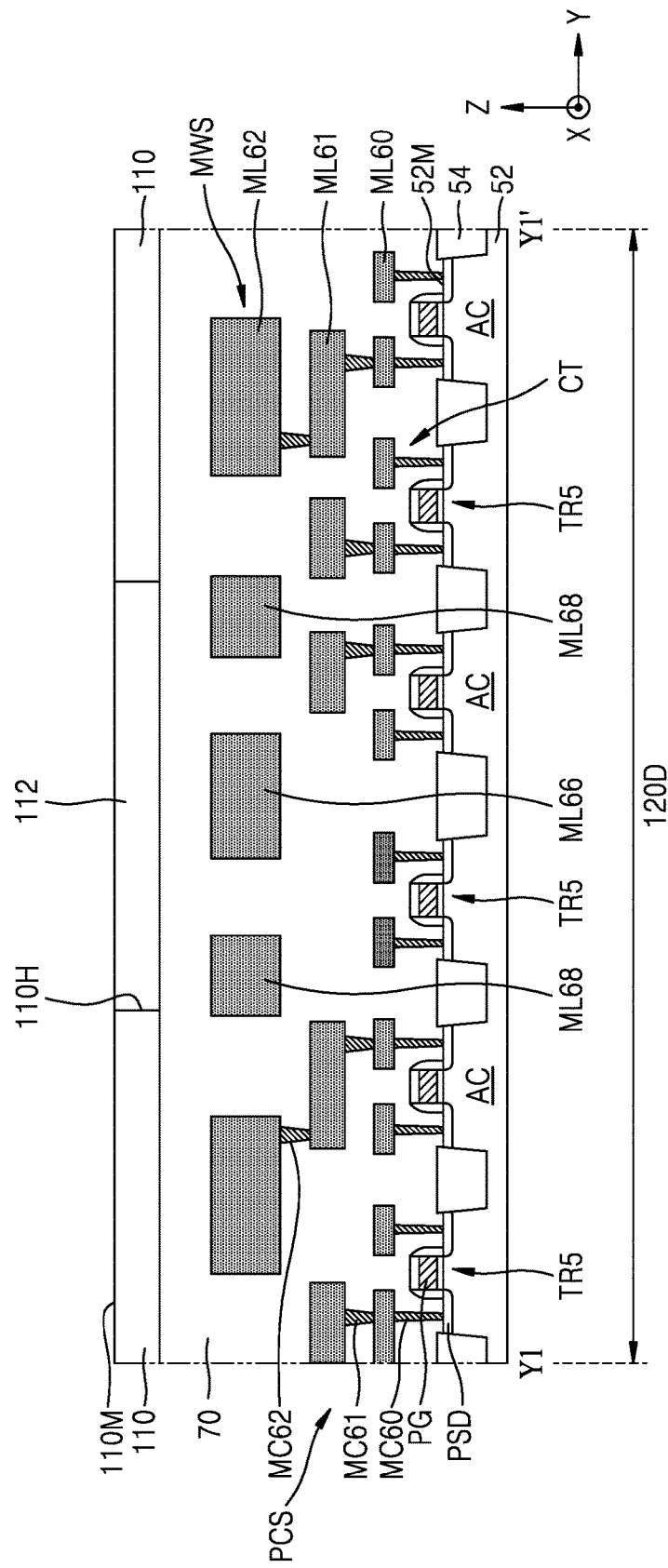

Referring to FIGS. 16A and 16B, the upper substrate 110 may be formed on the peripheral circuit structure PCS. A through hole 110H may be formed in the upper substrate 110, and a buried insulating film 112 may be formed to fill the through hole 110H.

Figure 17A:
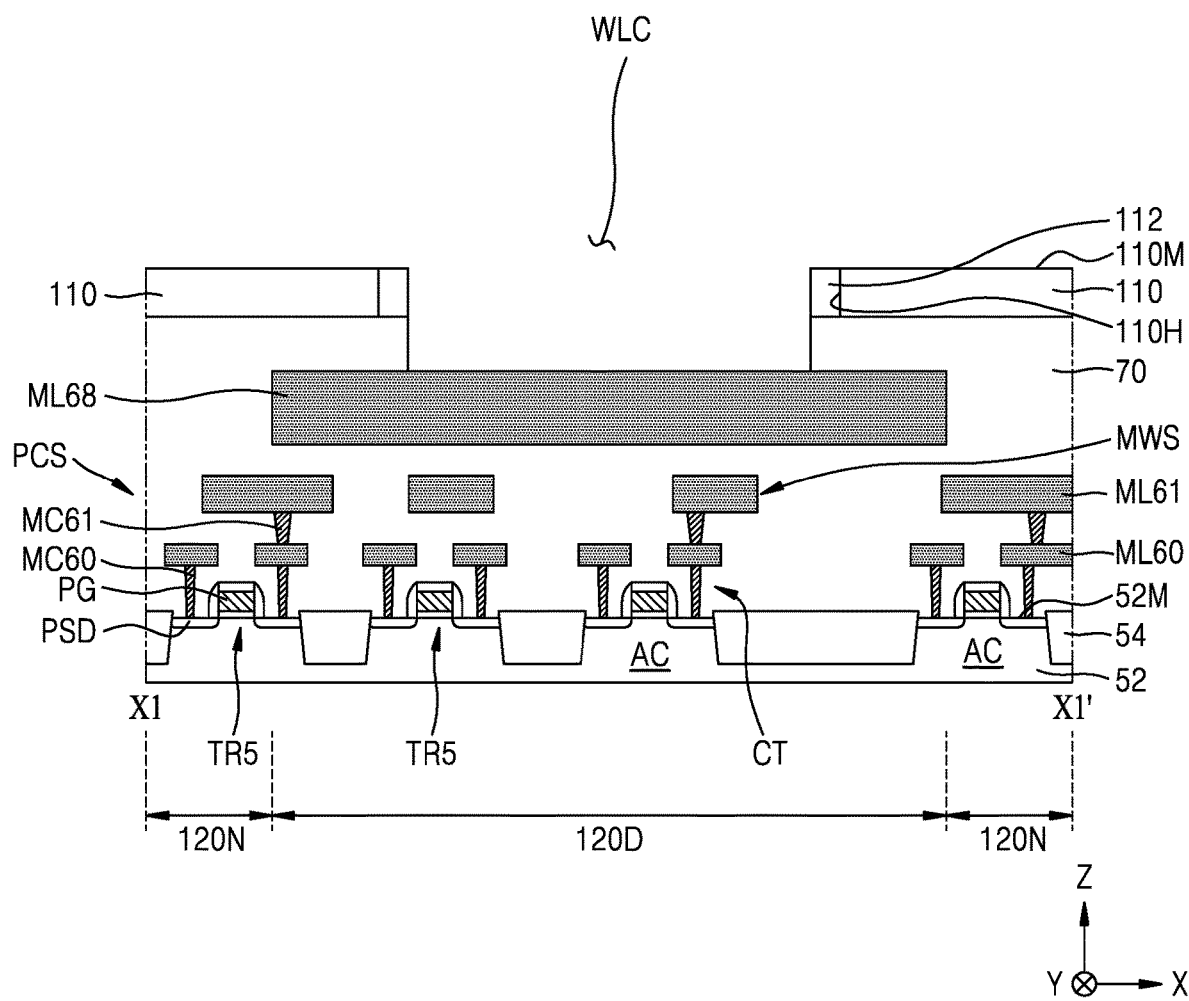
Figure 17B:
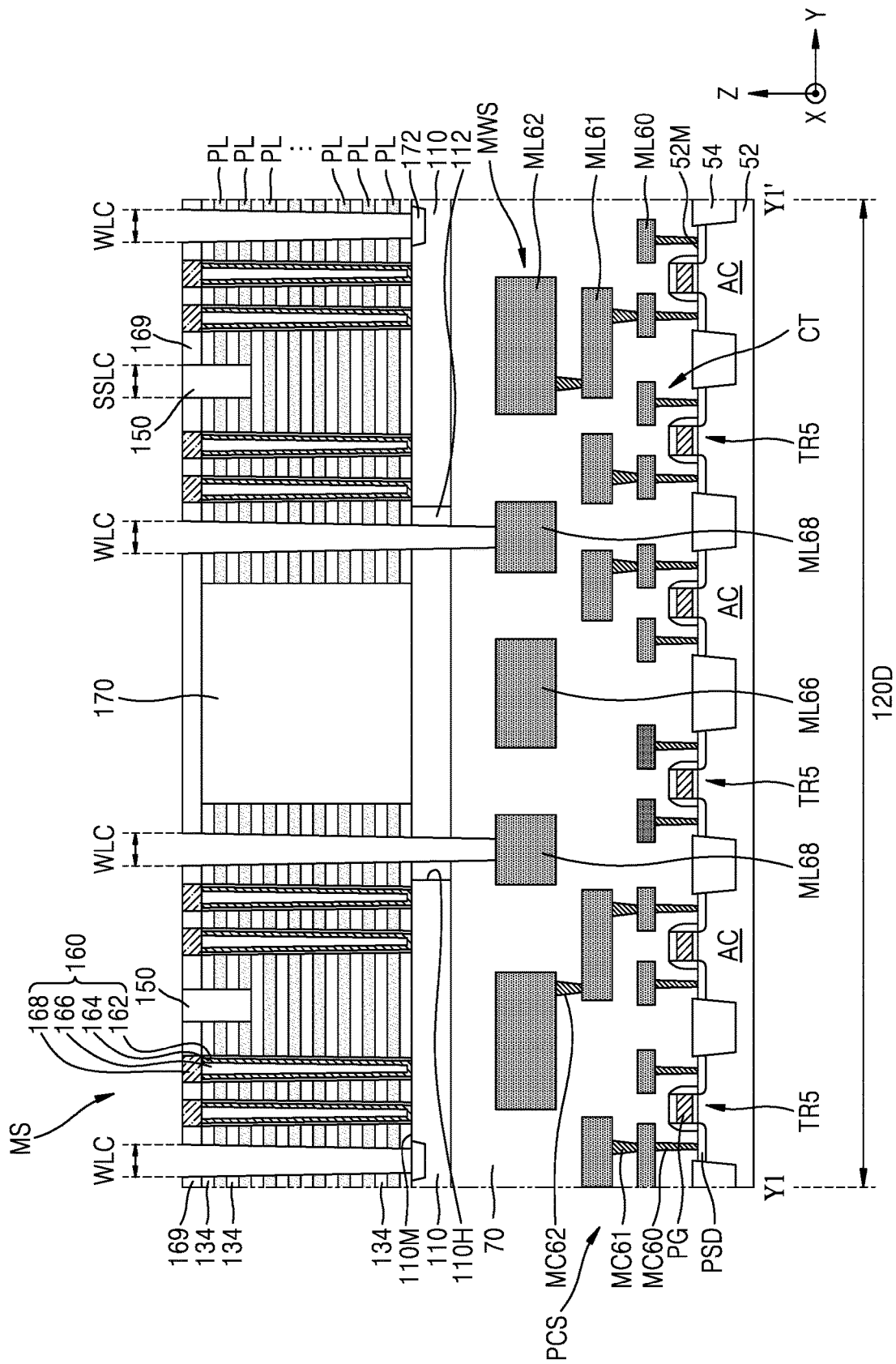

Referring to FIGS. 17A and 17B, a plurality of insulating films 134 and a plurality of sacrificial films PL may be alternately stacked one by one on the upper substrate 110 and the buried insulating film 112. The plurality of sacrificial films PL may include silicon nitride, silicon carbide, or polysilicon. The plurality of sacrificial films PL may respectively ensure spaces for forming a plurality of gate lines 130 during a subsequent process.

Subsequently, a portion of each of the plurality of insulating films 134 and a portion of each of the plurality of sacrificial films PL may be replaced by an insulating structure 170, and an upper insulating film 169 may be formed. The upper insulating film 169 may be formed to cover an uppermost insulating film 134 of the plurality of insulating films 134 and the insulating structure 170. Thereafter, a plurality of channel structures 160 may be formed to pass through the upper insulating film 169, the plurality of insulating films 134, and the plurality of sacrificial films PL, and a string selection line cut region SSLC and an insulating film 150 filling the string selection line cut region SSLC may be formed.

Afterwards, a plurality of word line cut regions WLC may be formed to pass through the upper insulating film 169, the plurality of insulating films 134, and the plurality of sacrificial films PL. A portion of the plurality of word line cut regions WLC may pass through the buried insulating film 112, which fills the through hole 110H, and a portion of the interlayer insulating film 70 of the peripheral circuit structure PCS. A top surface of the upper substrate 110 and a top surface of the floating interconnection layer ML68 may be exposed through the plurality of word line cut regions WLC. Dopant ions may be implanted into portions of the upper substrate 110, which are exposed through the plurality of word line cut regions WLC, to form a plurality of common source regions 172.

Figure 18A:
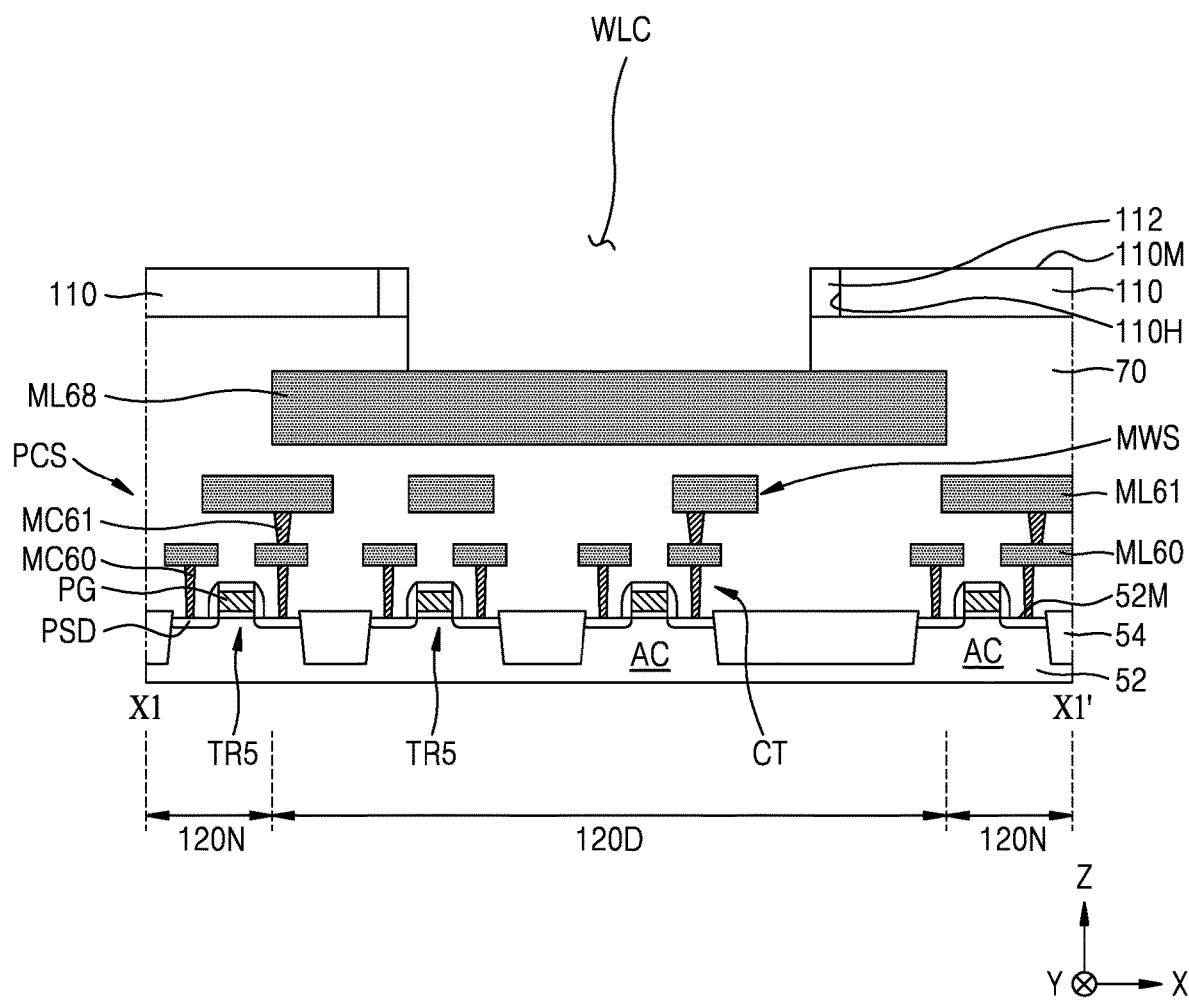
Figure 18B:
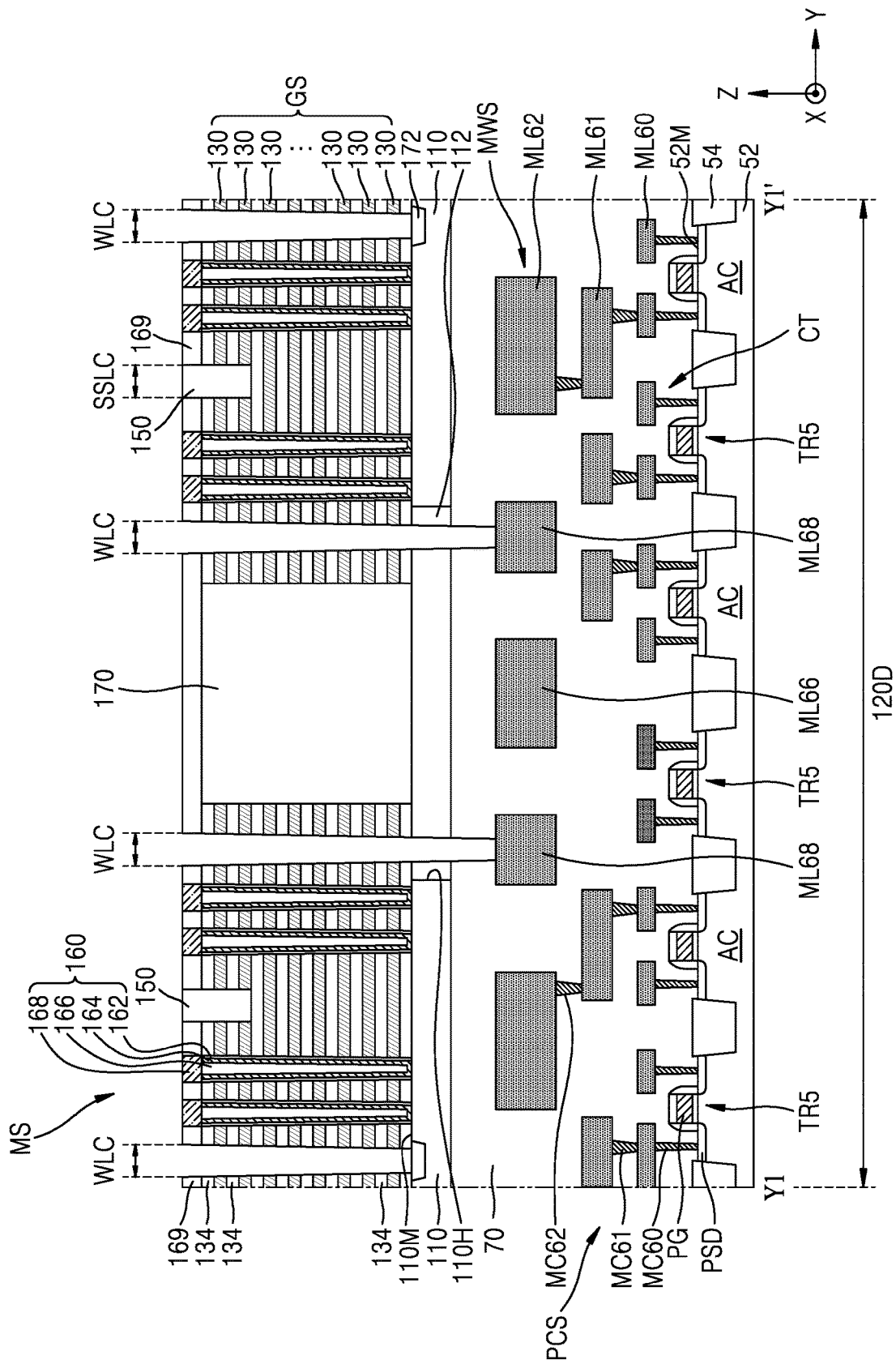

Referring to FIGS. 18A and 18B, the plurality of sacrificial films PL may be replaced by the plurality of gate lines 130 using the plurality of word line cut regions WLC in the resultant structure of FIGS. 17A and 17B. In some embodiments, to replace the plurality of sacrificial films PL (refer to FIG. 17B) by the plurality of gate lines 130, the plurality of sacrificial films PL exposed through the plurality of word line cut regions WLC may be selectively removed to prepare vacant spaces between the respective insulating films 134, and the vacant spaces may be filled with a conductive material to form the plurality of gate lines 130.

Figure 19A:
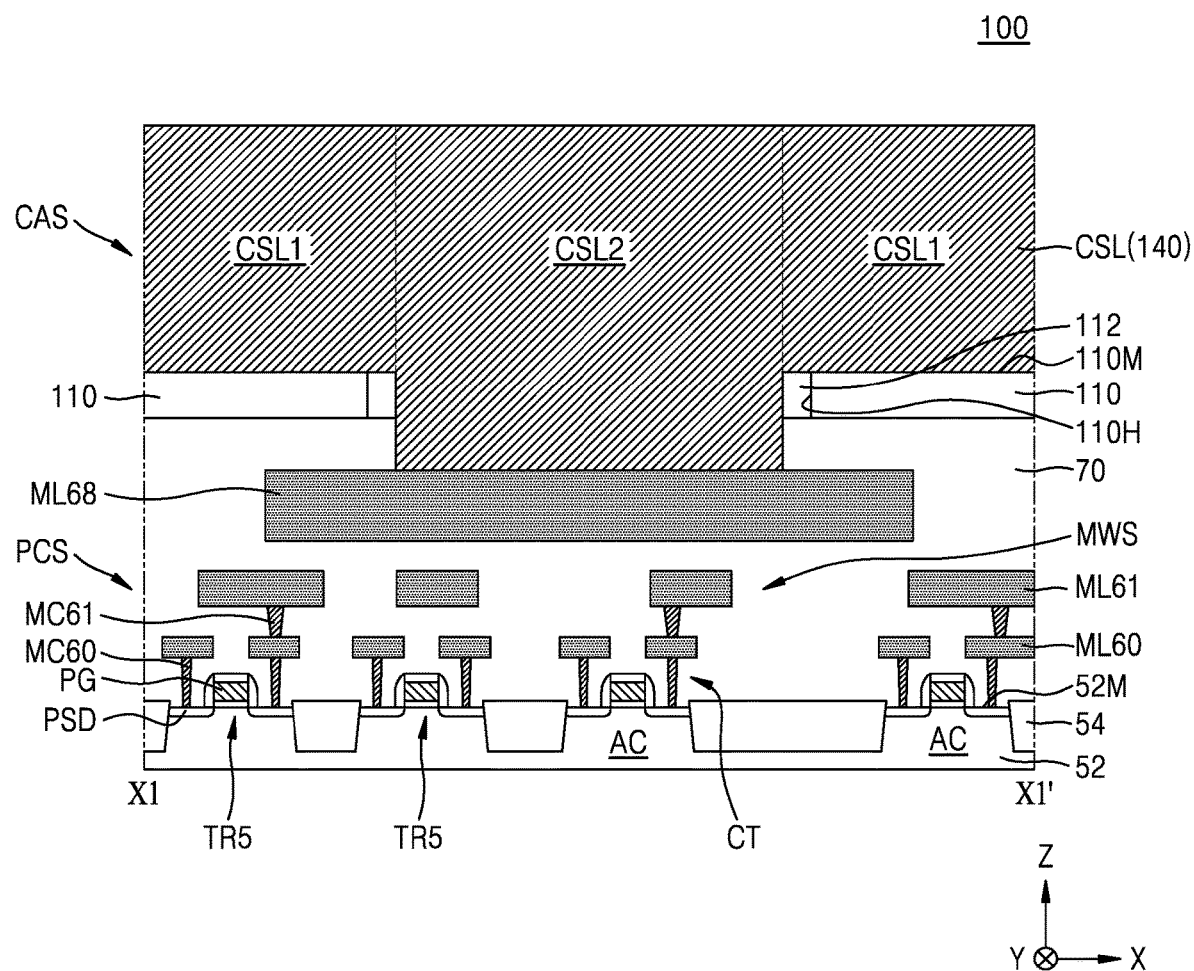
Figure 19B:
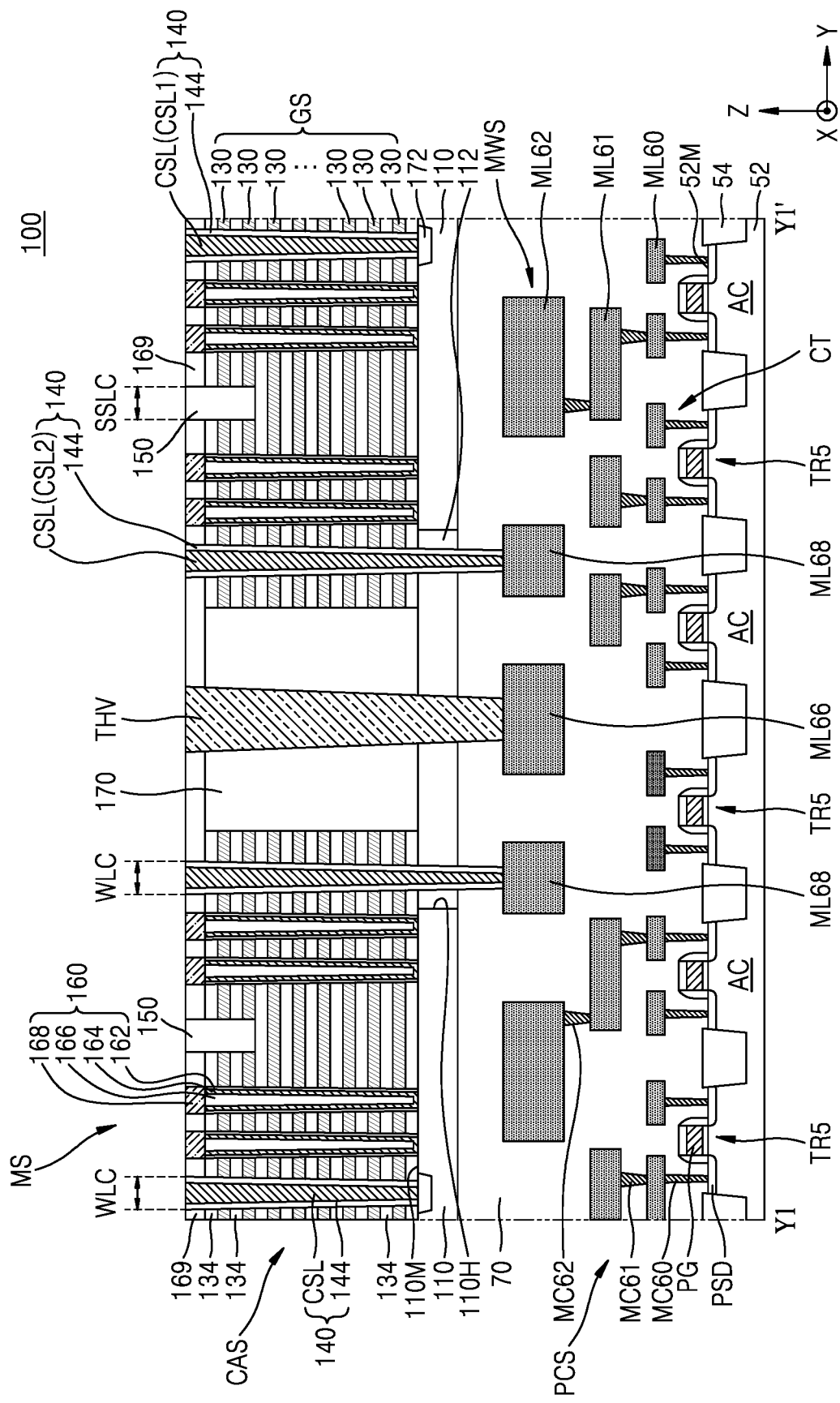

Referring to FIGS. 19A and 19B, a common source line structure 140 including insulating spacers 144 and a common source line CSL may be formed in each of the plurality of word line cut regions WLC. A plurality of through electrodes THV may be formed to pass through the upper insulating film 169, the insulating structure 170, the buried insulating film 112, and the interlayer insulating film 70 and to contact a top surface of the peripheral circuit interconnection layer ML66.

Thereafter, a plurality of bit lines BL may be formed on the plurality of channel structures 160 to manufacture the IC device 100 shown in FIGS. 4 and 5A to 5C. Also, additional lines may be formed above a top surface of the cell array structure CAS to electrically connect to the through electrodes THV.

The IC device 200 shown in FIG. 8 may be manufactured using a method similar to the method of manufacturing the IC device 100, which is described with reference to FIGS. 15A to 19B. However, a process of forming the insulating structure 170 may be omitted from the process described with reference to FIGS. 17A and 17B. Also, when the plurality of sacrificial films PL (refer to FIG. 17B) are replaced by the plurality of gate lines 130 in the process described with reference to FIGS. 18A and 18B, some of the plurality of sacrificial films PL may be left without being replaced by the plurality of gate lines 130 As a result, an insulating structure 270 having a multilayered structure including some of the plurality of sacrificial films PL and some of the plurality of insulating films 134 may be obtained. In this case, the plurality of first insulating films 272 shown in FIG. 8 may be the resultant structures obtained using some of the plurality of insulating films 134, and a plurality of second insulating films 274 shown in FIG. 8 may be the resultant structures obtained using some of the plurality of sacrificial films PL.

Although the IC device 100 shown in FIGS. 4 and 5A to 5C and the method of manufacturing the IC device 200 shown in FIG. 8 have been described with reference to FIGS. 15A to 19B, it will be understood that the IC devices 100A, 300, 400, and 500 shown in FIGS. 6, 7, and 9 to 14 and IC devices having variously modified and changed structures may be manufactured by applying various modifications and changes within the scope of the inventive concept.

Figure 20:
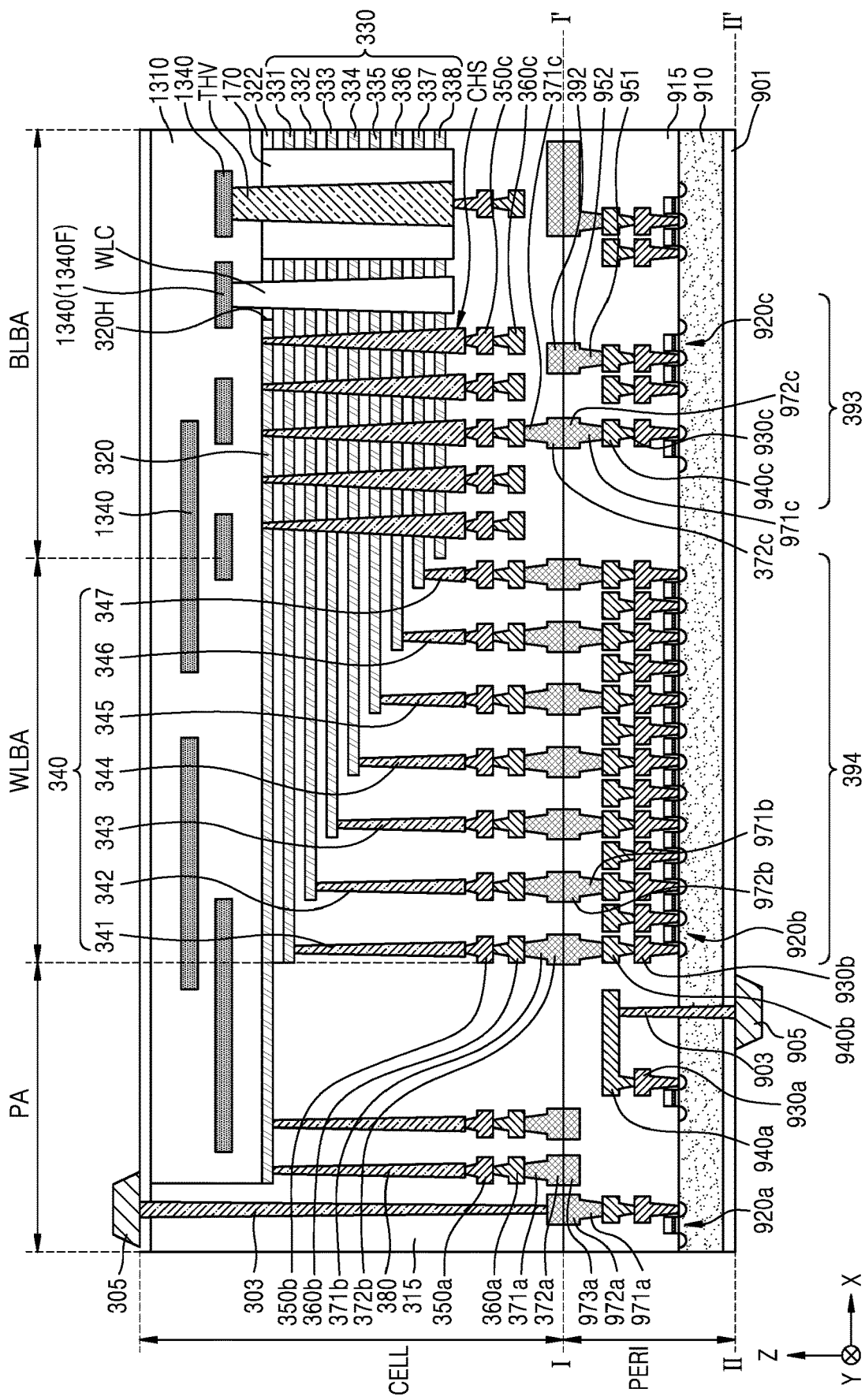
FIG. 20 illustrates a memory device having a chip-to-chip (C2C) structure, according to example embodiments of the inventive concepts.

FIG. 20 illustrates a memory device having a chip-to-chip (C2C) structure, according to example embodiments of the inventive concepts. The same reference numerals are used to denote the same elements throughout the drawings, repeated descriptions thereof will be omitted.

Referring to FIG. 20, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 910, an interlayer insulating layer 915, a plurality of circuit elements 920a, 920b, and 920c formed on the first substrate 910, first metal layers 930a, 930b, and 930c respectively connected to the plurality of circuit elements 920a, 920b, and 920c, and second metal layers 940a, 940b, and 940c formed on the first metal layers 930a, 930b, and 930c. In an example embodiment, the first metal layers 930a, 930b, and 930c may be formed of tungsten having relatively high resistance, and the second metal layers 940a, 940b, and 940c may be formed of copper having relatively low resistance.

In an example embodiment illustrate in FIG. 20, although the first metal layers 930a, 930b, and 930c and the second metal layers 940a, 940b, and 940c are shown and described, they are not limited thereto, and one or more metal layers may be further formed on the second metal layers 940a, 940b, and 940c. At least a portion of the one or more metal layers formed on the second metal layers 940a, 940b, and 940c may be formed of aluminum or the like having a lower resistance than those of copper forming the second metal layers 940a, 940b, and 940c.

The interlayer insulating layer 915 may be disposed on the first substrate 910 and cover the plurality of circuit elements 920a, 920b, and 920c, the first metal layers 930a, 930b, and 930c, and the second metal layers 940a, 940b, and 940c. The interlayer insulating layer 915 may include an insulating material such as silicon oxide, silicon nitride, or the like.

Lower bonding metals 971b and 972b may be formed on the second metal layer 940b in the word line bonding area WLBA. In the word line bonding area WLBA, the lower bonding metals 971b and 972b in the peripheral circuit region PERI may be electrically connected to upper bonding metals 371b and 372b in a bonding manner, and the lower bonding metals 971b and 972b and the upper bonding metals 371b and 372b may be formed of aluminum, copper, tungsten, or the like. Further, the lower bonding metals 971b and 972b in the peripheral circuit region PERI may be referred as first metal pads and the upper bonding metals 371b and 372b in the cell region CELL may be referred as second metal pads. The various metal layers 930a-930c and 940a-940c may be described herein as conductive interconnection layers or conductive interconnection layer patterns, or more specifically as peripheral circuit conductive interconnection layers or peripheral circuit conductive interconnection layer patterns. Though not shown, one or more of these patterns may be formed to be a floating pattern (e.g., not connected to any other circuit so as not to transfer a signal therethrough).

The peripheral circuit region PERI may include the peripheral circuit structure PCS described with reference to FIGS. 5a, 5b, and 8. As described with reference to FIGS. 6 and 7, the cell region CELL may include the memory cell region 120 and the pair of connection stepped regions 122C, which are respectively located on opposite sides of the memory cell region 120. The memory cell region 120 may include the cell array structure CAS described with reference to FIGS. 5A, 5B, and 8.

The cell region CELL may include at least one memory block. The cell region CELL may include a second substrate 1310 and a common source line 320 having a through hole 320H. The through hole 320H may be filled with an insulating film 322.

On the second substrate 1310, a plurality of word lines 331 to 338 (i.e., 330) may be stacked in a direction (Z direction), perpendicular to an upper surface of the second substrate 1310. At least one string select line and at least one ground select line may be arranged on and below the plurality of word lines 330, respectively, and the plurality of word lines 330 may be disposed between the at least one string select line and the at least one ground select line. The plurality of word lines 330, the least one string select line, and the at least one ground select line may correspond to the plurality of word lines 130 described with reference to FIGS. 5A, 5B, and 8.

A plurality of upper interconnection layers, including a plurality of upper interconnection layer patterns 1340, may be disposed in the second substrate 1310. The common source line 320 may be interposed between the second substrate 1310 and the plurality of word lines 330. A word line cut region WLC may extend across the plurality of word lines 330 and extend through the through hole 320H of the common source line 320 to be connected to a floating upper interconnection layer pattern 1340F selected from among the plurality of upper interconnection layer patterns 1340. Some of the plurality of upper interconnection layer patterns 1340 may extend in a lateral direction at the same vertical level in the second substrate 1310. The floating conductive interconnection layer pattern 1340F may be laterally spaced apart from other upper interconnection layer patterns 1340 from among the some of the plurality of upper interconnection layers. The floating conductive interconnection layer pattern 1340F may be separated from the common source line 320.

The word line cut region WLC may comprise a first portion extending lengthwise in a first lateral direction (Y direction in FIG. 20) across plurality of word lines 330 and the through hole 320H of the common source line 320, and a second portion being integrally connected to the first portion and penetrating the second substrate 1310 in the vertical direction (Z direction).

An insulating structure 170 may be arranged on the second substrate 1310. The insulating structure 170 may pass through the plurality of word lines 130 and the common source line 320 in the cell region CELL and extend in a vertical direction (Z direction). A through electrode THV may pass through the insulating structure 170 and be connected to one upper interconnection layer pattern 1340 from among the plurality of upper interconnection layer patterns 1340. The upper interconnection layer pattern 1340 connected to the through electrode THV may be laterally spaced apart from the floating upper interconnection layer pattern 1340F and may be electrically separated from the floating upper interconnection layer pattern 1340F. The through electrode THV may penetrate the plurality of word lines 330 in the vertical direction (Z direction).

The cell region CELL may include the memory cell region 120 described with reference to FIG. 4, and the memory cell region 120 may include a plurality of normal cell regions 120N and a dummy cell region 120D as described with reference to FIG. 4. The through hole 320H of the common source line 320 may be positioned below the dummy cell region 120D.

In the bit line bonding area BLBA, a channel structure CHS may extend in a direction, perpendicular to the upper surface of the second substrate 1310, and pass through the plurality of word lines 330, the at least one string select line, and the at least one ground select line in the cell region CELL. The channel structure CHS may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (Y direction), parallel to the upper surface of the second substrate 1310. The channel structure CHS may extend in a direction perpendicular to an upper surface of the common source line 320. The word line cut region WLC may be disposed between the channel structure CHS and the through electrode THV. The through electrode THV may be laterally spaced apart from the channel structure CHS with the word line cut region WLC interposed between the channel structure CHS and the through electrode THV.

In an example embodiment illustrated in FIG. 20, an area in which the channel structure CHS, the bit line 360c, and the like are disposed may be defined as the bit line bonding area BLBA. In the bit line bonding area BLBA, the bit line 360c may be electrically connected to the circuit elements 920c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 971c and 972c connected to the circuit elements 920c of the page buffer 393.

In the word line bonding area WLBA, the plurality of word lines 330 may extend in a second direction (X direction), parallel to the upper surface of the second substrate 1310, and may be connected to a plurality of cell contact plugs 341 to 347 (i.e., 340). The plurality of word lines 330 and the plurality of cell contact plugs 340 may be connected to each other at pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 971b and 972b of the peripheral circuit region PERI in the word line bonding area WLBA.

The plurality of cell contact plugs 340 may be electrically connected to the circuit elements 920b providing a row decoder 394 in the peripheral circuit region PERI. In an example embodiment, operating voltages of the circuit elements 920b providing the row decoder 394 may be different than operating voltages of the circuit elements 920c providing the page buffer 393. For example, operating voltages of the circuit elements 920c providing the page buffer 393 may be greater than operating voltages of the circuit elements 920b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 305 and 905 may be disposed in the external pad bonding area PA. Referring to FIG. 20, a lower insulating film 901 covering a lower surface of the first substrate 910 may be formed below the first substrate 910, and a first input-output pad 905 may be formed on the lower insulating film 901. The first input-output pad 905 may be connected to at least one of the plurality of circuit elements 920a, 920b, and 920c disposed in the peripheral circuit region PERI through a first input-output contact plug 903, and may be separated from the first substrate 910 by the lower insulating film 901. In addition, a side insulating film may be disposed between the first input-output contact plug 903 and the first substrate 910 to electrically separate the first input-output contact plug 903 and the first substrate 910.

Referring to FIG. 20, an upper insulating film 301 covering the upper surface of the second substrate 1310 may be formed on the second substrate 1310, and a second input-output pad 305 may be disposed on the upper insulating layer 301. The second input-output pad 305 may be connected to at least one of the plurality of circuit elements 920a, 920b, and 920c disposed in the peripheral circuit region PERI through a second input-output contact plug 303.

According to embodiments, the second substrate 1310 and the common source line 320 may not be disposed in an area in which the second input-output contact plug 303 is disposed. Also, the second input-output pad 305 may not overlap the word lines 330 in the third direction (Z direction). Referring to FIG. 20, the second input-output contact plug 303 may be separated from the second substrate 1310 in a direction, parallel to the upper surface of the second substrate 1310, and may pass through the interlayer insulating layer 315 of the cell region CELL to be connected to the second input-output pad 305.

According to embodiments, the first input-output pad 905 and the second input-output pad 305 may be selectively formed. For example, the memory device 1000 may include only the first input-output pad 905 disposed on the first substrate 910 or the second input-output pad 305 disposed on the second substrate 1310. Alternatively, the memory device 1000 may include both the first input-output pad 905 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include lower metal patterns 971a, 972a, and 973a formed in the peripheral circuit region PERI. Each of the lower metal patterns 971a, 972a, and 973a may be connected to corresponding pattern from among upper metal patterns 371a and 372a formed in the cell region CELL. In the peripheral circuit region PERI, the lower metal pattern 973a formed in the uppermost metal layer of the peripheral circuit region PERI may not be connected to a contact (e.g., may not be connected to a contact of the peripheral circuit region PERI). Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 971b and 972b may be formed on the second metal layer 940b in the word line bonding area WLBA. In the word line bonding area WLBA, the lower bonding metals 971b and 972b of the peripheral circuit region PERI may be electrically connected to the upper bonding metals 371b and 372b of the cell region CELL by a Cu—Cu (e.g., metal-to-metal) bonding.

Further, the bit line bonding area BLBA, an upper metal pattern 392, corresponding to a lower metal pattern 952 formed in the uppermost metal layer of the peripheral circuit region PERI, and having the same shape as the lower metal pattern 952 of the peripheral circuit region PERI, may be formed in an uppermost metal layer of the cell region CELL. A contact may not be formed on the upper metal pattern 392 formed in the uppermost metal layer of the cell region CELL (e.g., may not be formed on the upper metal pattern 392 within the cell region CELL).

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in the other one of the cell region CELL and the peripheral circuit region PERI, and a contact may not be formed on the reinforcement metal pattern (e.g., a contact may not be formed between the metal pattern and the reinforcement metal pattern).

In the description above, in connection with FIG. 20, the directions "upper" and "lower" are used in connection with the peripheral circuit region PERI and the cell region CELL. As used in connection with FIG. 20, the term "upper" to describe components with respect to the peripheral circuit region PERI refers to a location extending away from a surface of the first substrate 910 and into the interlayer insulating layer 915. Similarly, the term "upper" to describe components with respect to the cell region CELL refers to a location extending away from a surface of the second substrate 310 and into the interlayer insulating layer 315.

It should be noted that the peripheral circuit region PERI of FIG. 20 may be replaced with the peripheral circuit region PERI of other embodiments, for example, FIGS. 15A, 15B, 16A, or 16B.

Figure 21:
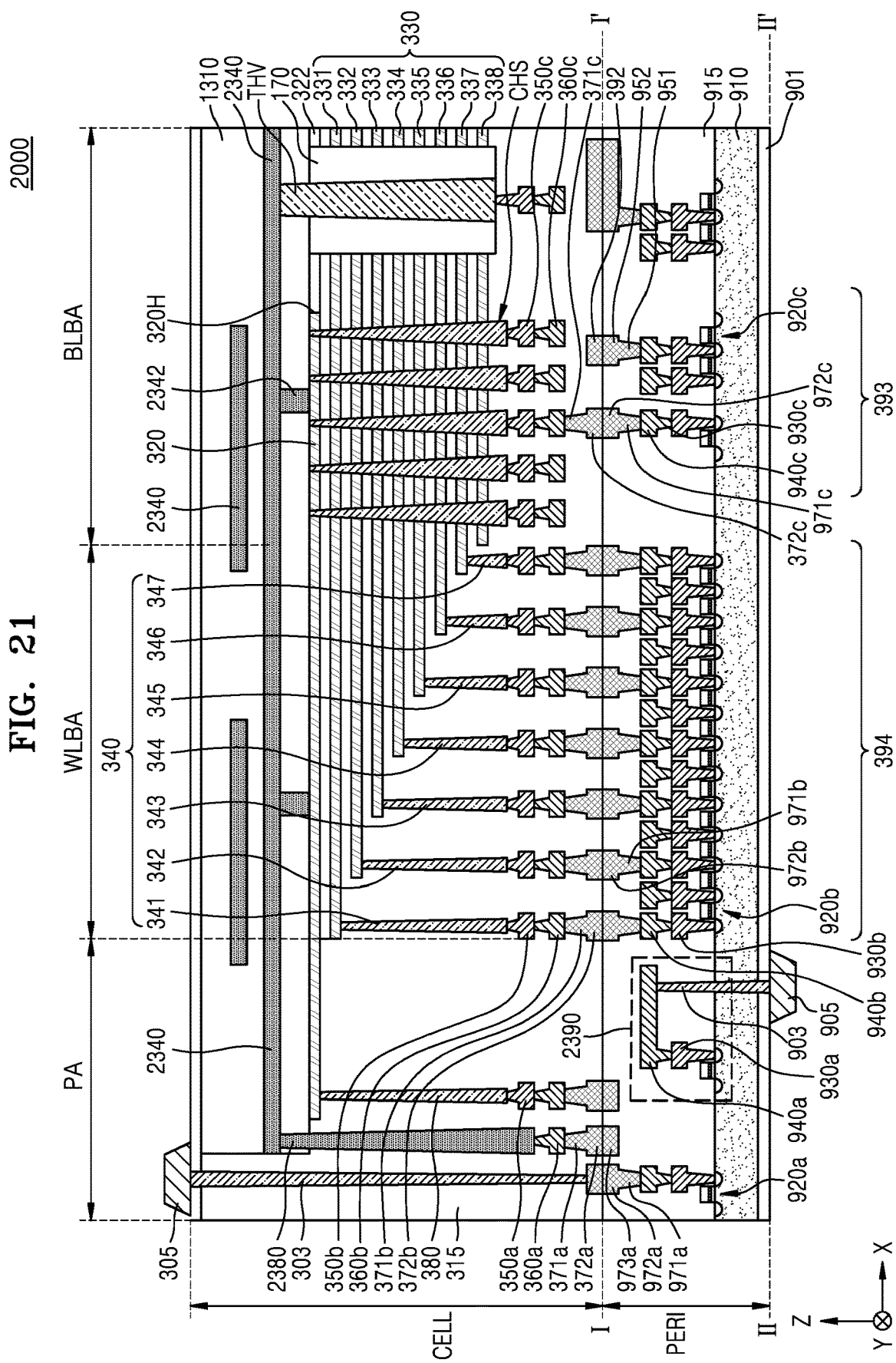
FIG. 21 illustrates a memory device having a chip-to-chip (C2C) structure, according to example embodiments of the inventive concepts.

FIG. 21 illustrates a memory device having a chip-to-chip (C2C) structure, according to example embodiments of the inventive concepts. The same reference numerals are used to denote the same elements throughout the drawings, repeated descriptions thereof will be omitted.

Referring to FIG. 21, a memory device 2000 may have substantially the same configuration as the memory device 1000 described with reference to FIG. 20 However, the IC device 100A may include a plurality of upper interconnection layers including a plurality of upper interconnection layer patterns 2340 instead of the plurality of upper interconnection layer patterns 1340 of the memory device 1000. The plurality of upper interconnection layers may be disposed in the second substrate 1310.

The through electrode THV may pass through the through hole 320H of the common source line 320 in the cell region CELL. The through electrode THV may be connected to one upper interconnection layer pattern 2340 from among the plurality of upper interconnection layer patterns 2340. Each of the plurality of upper interconnection layer patterns 2340 may be connected to the common source line 320 through a contact plug 2342. Some of the plurality of upper interconnection layer patterns 2340 may be arranged in the Y direction at the same vertical level. At least one of the plurality of upper interconnection layer patterns 2340 may be connected to a CSL driver 2390 in the peripheral circuit region PERI through a contact plug 2380 and the second metal layer 360*a*.

While the inventive concept has been particularly shown and described with reference to embodiments thereof, it will be understood that various changes in form and details may be made therein without departing from the spirit and scope of the following claims.

What is claimed is:

1. A memory device comprising:
a peripheral circuit region comprising a first substrate, a plurality of metal layers over the first substrate, and a first metal pad;
a cell region comprising a second substrate, a plurality of gate lines over the second substrate, a plurality of upper interconnection layers in the second substrate, and a second metal pad, wherein the cell region is vertically connected to the peripheral circuit region by the first metal pad and the second metal pad;
a common source line between the second substrate and the plurality of gate lines, the common source line comprising a through hole; and
a word line cut region extending across the plurality of gate lines and extending through the through hole of the common source line to be connected to a first upper interconnection layer pattern from among the plurality of upper interconnection layers.

2. The memory device of claim 1, wherein
the first upper interconnection layer pattern is a floating conductive interconnection layer pattern, which is laterally spaced apart from other upper interconnection layer patterns from among the plurality of upper interconnection layers.

3. The memory device of claim 1, wherein
the peripheral circuit region comprises a peripheral circuit structure, the peripheral circuit structure comprising:
a plurality of circuits formed on the first substrate;
a plurality of peripheral circuit conductive interconnection layer patterns connected to the plurality of circuits; and
a floating conductive interconnection layer pattern formed at the same vertical level as the plurality of peripheral circuit conductive interconnection layer patterns.

4. The memory device of claim 1, further comprising a through electrode passing through the plurality of gate lines and the common source line, the through electrode being connected to a second upper interconnection layer pattern from among the plurality of upper interconnection layers.

5. The memory device of claim 1, further comprising:
an insulating structure arranged on the second substrate, the insulating structure passing through the plurality of gate lines and the common source line in the cell region and extending in a vertical direction; and
a through electrode passing through the insulating structure and being connected to a second upper interconnection layer pattern from among the plurality of upper interconnection layers.

6. The memory device of claim 1, wherein
the cell region comprises a memory cell region, wherein the memory cell region comprises a normal cell region and a dummy cell region, and
wherein the through hole of the common source line is positioned below the dummy cell region.

7. The memory device of claim 1, further comprising:
a channel structure extending in a direction perpendicular to an upper surface of the common source line, and passing through the plurality of gate lines in the cell region; and
a through electrode passing through the plurality of gate lines in the cell region,
wherein the word line cut region is between the channel structure and the through electrode.

8. The memory device of claim 1, wherein each of the first metal pad and the second metal pad is formed of copper (Cu), aluminum (Al), or tungsten (W).

9. The memory device of claim 1, wherein the first upper interconnection layer pattern is separated from the common source line.

10. The memory device of claim 1, further comprising a through electrode passing through the through hole of the common source line in the cell region and being connected to a second upper interconnection layer pattern from among the plurality of upper interconnection layers,
wherein the second upper interconnection layer pattern is connected to the common source line through a contact plug.

11. A memory device comprising:
a peripheral circuit region comprising a peripheral circuit structure and a first metal pad; and
a cell region comprising a substrate, a plurality of upper interconnection layers in the substrate, a cell array structure on the substrate, a common source line interposed between the substrate and the cell array structure, and a second metal pad, wherein the cell region is vertically connected to the peripheral circuit region by the first metal pad and the second metal pad,
wherein the cell array structure comprises:
a memory stack including a memory cell region and a connection stepped region located at one side of the memory cell region, the memory cell region having a plurality of gate lines; and
a word line cut region extending across the plurality of gate lines and extending through a through hole of the common source line to be connected to a first upper interconnection layer pattern from among the plurality of upper interconnection layers, the first upper interconnection layer pattern being a floating conductive interconnection layer pattern spaced apart from other upper interconnection layer patterns from among the plurality of upper interconnection layers.

12. The memory device of claim 11, wherein the cell region further comprises:
a through electrode penetrating the plurality of gate lines in a vertical direction in the memory cell region and extending to a second upper interconnection layer pattern from among the plurality of upper interconnection layers through the through hole of the common source line.

13. The memory device of claim 11, wherein the word line cut region comprises a first portion extending lengthwise in a first lateral direction across the plurality of gate lines and the through hole of the common source line, and a second portion being integrally connected to the first portion and penetrating the substrate in a vertical direction.

14. The memory device of claim 11, wherein
the peripheral circuit structure comprises a plurality of circuits, a plurality of peripheral circuit conductive interconnection layer patterns connected to the plurality of circuits, and a floating conductive interconnection layer pattern laterally spaced apart from the plurality of peripheral circuit conductive interconnection layer patterns.

15. The memory device of claim 11, wherein the first upper interconnection layer pattern is separated from the common source line.

16. The memory device of claim 11, further comprising: a through electrode passing through the through hole of the common source line in the cell region and being connected to a second upper interconnection layer pattern from among the plurality of upper interconnection layers, wherein the second upper interconnection layer pattern is connected to the common source line through a contact plug.

17. The memory device of claim 11, further comprising:
a channel structure extending in a vertical direction on the common source line, and passing through the plurality of gate lines in the cell region;
an insulating structure passing through the plurality of gate lines and the common source line in the cell region and extending in the vertical direction; and
a through electrode passing through the insulating structure and connected to a second upper interconnection layer pattern from among the plurality of upper interconnection layers,
wherein the through electrode is laterally spaced apart from the channel structure with the word line cut region interposed between the channel structure and the through electrode.

18. A memory device comprising:
a peripheral circuit region comprising a first substrate, a plurality of peripheral circuit conductive interconnection layers formed on the first substrate, and a first metal pad;
a cell region comprising a second substrate, a plurality of upper interconnection layers in the second substrate, a cell array structure comprising a plurality of gate lines on the second substrate, a common source line interposed between the second substrate and the cell array structure, and a second metal pad, wherein the cell region is vertically connected to the peripheral circuit region by the first metal pad and the second metal pad; and
a word line cut region comprising a first portion and a second portion, the first portion extending lengthwise in a lateral direction across the plurality of gate lines and a through hole, the second portion being integrally connected to the first portion and extending through a portion of the second substrate to a first upper interconnection layer pattern from among the plurality of upper interconnection layers.

19. The memory device of claim 18, wherein
a plurality of upper interconnection layer patterns including the first upper interconnection layer pattern extend in the lateral direction at the same vertical level in the second substrate, and
wherein the first upper interconnection layer pattern is a floating conductive interconnection layer pattern.

20. The memory device of claim 18, further comprising:
a channel structure extending in a vertical direction on the common source line, and passing through the plurality of gate lines in the cell region;
an insulating structure passing through the plurality of gate lines and the common source line in the cell region and extending in the vertical direction; and
a through electrode passing through the insulating structure and being connected to a second upper interconnection layer pattern from among the plurality of upper interconnection layers,
wherein the through electrode is laterally spaced apart from the channel structure with the word line cut region interposed between the channel structure and the through electrode.

\* \* \* \* \*